(12) United States Patent
Chang et al.

(10) Patent No.: US 11,043,408 B2
(45) Date of Patent: Jun. 22, 2021

(54) METHOD OF FORMING FINFET DEVICES WITH EMBEDDED AIR GAPS

(71) Applicant: Taiwan Semiconductor Manufacturing Co., Ltd., Hsin-Chu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/203,987

(22) Filed: Nov. 29, 2018

(65) Prior Publication Data

US 2019/0148215 A1 May 16, 2019

Related U.S. Application Data

(62) Division of application No. 15/847,307, filed on Dec. 19, 2017, now Pat. No. 10,366,915.

(60) Provisional application No. 62/586,233, filed on Nov. 15, 2017.

(51) Int. Cl.
*H01L 21/764* (2006.01)
*H01L 27/092* (2006.01)
*H01L 21/8238* (2006.01)
*H01L 29/66* (2006.01)
*H01L 29/06* (2006.01)

(52) U.S. Cl.
CPC .... *H01L 21/764* (2013.01); *H01L 21/823821* (2013.01); *H01L 21/823878* (2013.01); *H01L 27/0924* (2013.01); *H01L 29/0649* (2013.01); *H01L 29/66545* (2013.01)

(58) Field of Classification Search
None
See application file for complete search history.

(56) References Cited

U.S. PATENT DOCUMENTS

| 7,425,740 B2 | 9/2008 | Liu et al. |
| 7,667,271 B2 | 2/2010 | Yu et al. |
| 7,910,453 B2 | 3/2011 | Xu et al. |

(Continued)

FOREIGN PATENT DOCUMENTS

| CN | 107046031 A | 8/2017 |
| KR | 20160056693 A | 5/2016 |

(Continued)

*Primary Examiner* — Dung A. Le
(74) *Attorney, Agent, or Firm* — Haynes and Boone, LLP

(57) ABSTRACT

A dummy gate layer is formed over a substrate. A patterned mask is formed over the dummy gate layer. The patterned mask includes an opening. The opening is etched into the dummy gate layer. The patterned mask serves as a protective mask as the opening is etched. A lateral etching process is performed to portions of the dummy gate layer laterally exposed by the opening. The lateral etching process etches away the dummy gate layer without substantially affecting the patterned mask. After the lateral etching process is performed, a dielectric material is formed in the opening. An air gap is formed in the dielectric material. After the air gap is formed, the patterned mask and portions of the dielectric material formed over the patterned mask are removed. The dummy gate layer is replaced with a metal-containing gate.

20 Claims, 23 Drawing Sheets

(56) References Cited

U.S. PATENT DOCUMENTS

| | | |
|---|---|---|
| 7,915,156 B2 | 3/2011 | Aoyama et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,508,727 B2 | 11/2016 | Park et al. |
| 9,530,890 B1 | 12/2016 | Pranatharthiharam et al. |
| 9,577,115 B2 | 2/2017 | Cho et al. |
| 9,741,854 B2 | 8/2017 | Bai et al. |
| 9,805,983 B1 | 10/2017 | Cheng et al. |
| 10,381,262 B2 * | 8/2019 | Cheng .................. H01L 21/764 |
| 2008/0014760 A1 | 1/2008 | Murata et al. |
| 2009/0302367 A1 | 12/2009 | Nagano |
| 2011/0068407 A1 | 3/2011 | Yeh et al. |
| 2011/0084340 A1 * | 4/2011 | Yuan ................ H01L 21/76224 |
| | | 257/368 |
| 2012/0132982 A1 | 5/2012 | Lee et al. |
| 2013/0011983 A1 | 1/2013 | Tsai et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0263003 A1 | 9/2015 | Lee et al. |
| 2015/0348966 A1 | 12/2015 | Zhao et al. |
| 2016/0049336 A1 | 2/2016 | Han et al. |
| 2016/0260801 A1 | 9/2016 | Zhao et al. |
| 2017/0194195 A1 * | 7/2017 | Cohen ................ H01L 21/0331 |
| 2017/0229451 A1 | 8/2017 | Chang et al. |
| 2017/0229452 A1 | 8/2017 | Chang et al. |
| 2019/0148215 A1 | 5/2019 | Chang et al. |

FOREIGN PATENT DOCUMENTS

| | | |
|---|---|---|
| KR | 20160074859 A | 6/2016 |
| KR | 20170062079 A | 6/2017 |
| TW | 201729264 A | 8/2017 |
| TW | 201729265 A | 8/2017 |

* cited by examiner

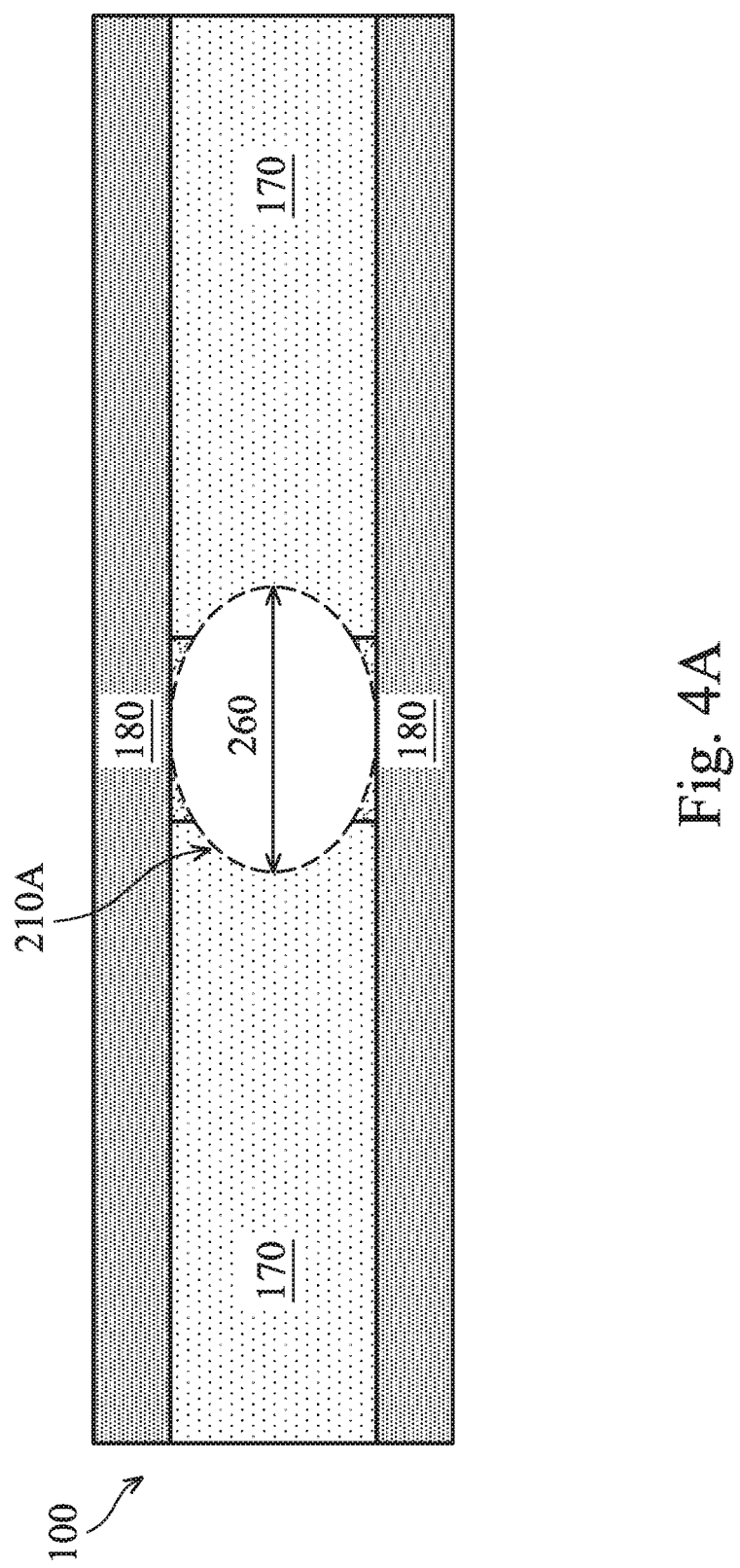

METHOD OF FORMING FINFET DEVICES WITH EMBEDDED AIR GAPS

PRIORITY DATA

This application is a divisional of U.S. application Ser. No. 15/847,307, filed Dec. 19, 2017 which claims priority from U.S. Provisional Patent Application No. 62/586,223, entitled "FinFET Devices with Embedded Air Gaps and the Fabrication thereof" and filed on Nov. 15, 2017, the disclosures of which are incorporated herein in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, the fabrication of FinFET devices may include a gate-replacement process. Due to ever-decreasing feature sizes, the small process windows for some steps of the gate-replacement process may lead to leakage and/or other defects.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-8A are top views of a FinFET device at different stages of fabrication according to various embodiments of the present disclosure.

FIGS. 2B-8B are cross-sectional side views of a FinFET device at different stages of fabrication according to various embodiments of the present disclosure.

DETAILED DESCRIPTION

Figure 1:
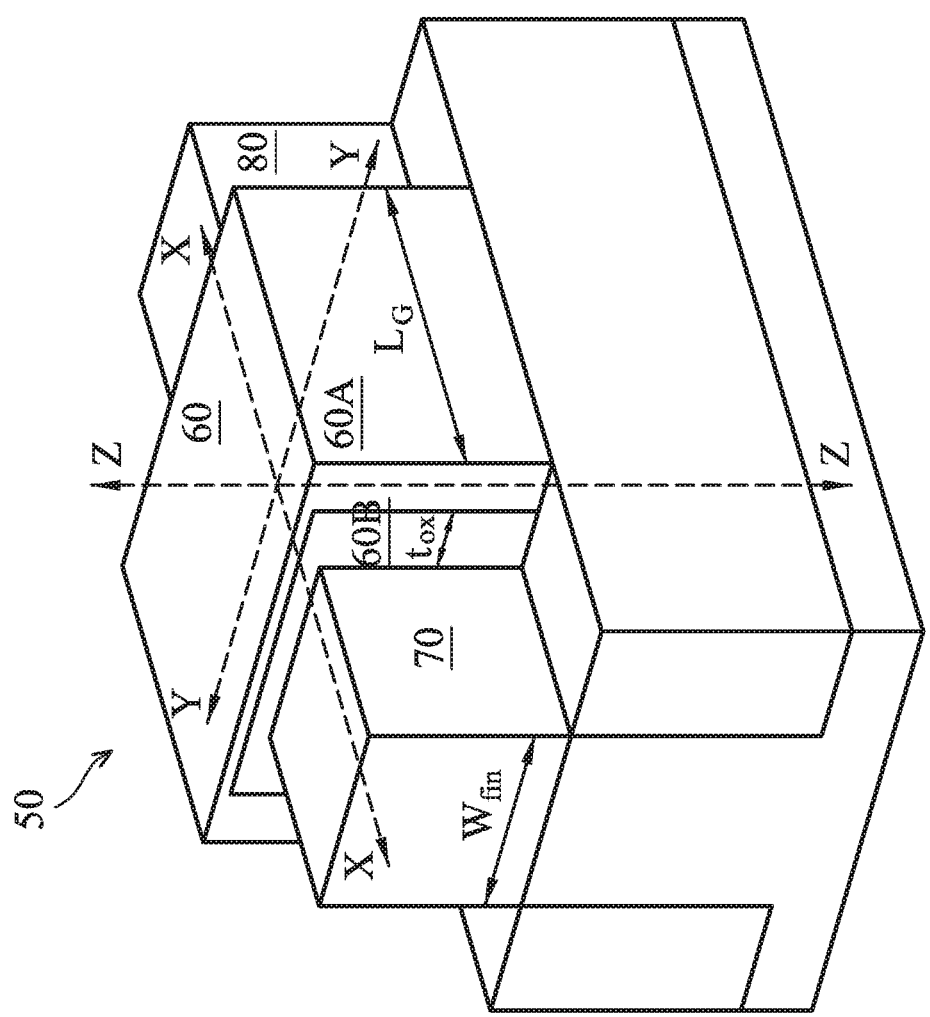
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor FinFET device and an N-type metal-oxide-semiconductor FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin structure extends along an X-direction shown in FIG. 1. The fin structure has a fin width $W_{fin}$ measured along a Y-direction that is orthogonal to the X-direction. A gate structure 60 of the FinFET device 50 partially wraps around this fin structure, for example around the top surface and the opposing sidewall surfaces of the fi structure n. Thus, a portion of the gate structure 60 is located over the fin structure in a Z-direction that is orthogonal to both the X-direction and the Y-direction.

$L_G$ denotes a length (or width, depending on the perspective) of the gate structure 60 measured in the X-direction. The gate structure 60 may include a gate electrode component 60A and a gate dielectric component 60B. The gate dielectric 60B has a thickness $t_{ox}$ measured in the Y-direction. A portion of the gate structure 60 is located over a dielectric isolation structure such as shallow trench isolation (STI). A source 70 and a drain 80 of the FinFET device 50 are formed in extensions of the fin structure on opposite sides of the gate structure 60. A portion of the fin structure being wrapped around by the gate structure 60 serves as a channel of the FinFET device 50. The effective channel length of the FinFET device 50 is determined by the dimensions of the fin structure.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. FinFET devices are also compatible with a high-k metal gate (HKMG) process flow. Thus, FinFET devices may be implemented as HKMG devices where the gates each that have a high-k gate dielectric and a metal gate electrode. For these benefits discussed above, it may be desirable to design an integrated circuit (IC) chip using FinFET devices for a portion of, or the entire IC chip.

However, traditional FinFET fabrication methods may still have shortcomings. For example, FinFET fabrication may include a gate-replacement process, where a dummy gate is replaced by the gate structure 60, which may be a high-k metal gate. As a part of the gate replacement process, a "cut" may be made to the dummy gate to break up the dummy gate, so as to define individual dummy gates. The individual dummy gates are replaced by the high-k metal gates later. Thus, the "cut" defines the spacing or distance between the dummy gates in a direction in which the dummy gates extend. However, due to ever-shrinking feature sizes, the "cut" may not sufficiently break up adjacent dummy gates. Undesirable residue of the dummy gates that remain (but should have been removed during the "cut") may lead to leakage or line-end bridging issues between the eventually-formed high-k metal gates, which could adversely impact device performance and/or decrease yield.

To overcome the problems discussed above, the present disclosure performs a "pull back" as a part of the "cut" process to enlarge the process window and reduce the possibility of line-end bridging. In addition, due to the unique process flow, the resulting FinFET devices may contain voids or air gaps between adjacent gate structures. These voids or gaps may improve the electrical isolation between the adjacent gate structures. As a result, the FinFET devices fabricated herein may have improved device performance and yield compared to conventional FinFET devices. The fabrication process flow of the present disclosure is discussed below in more detail with reference to FIGS. 2A-8A, 2B-8B, and 9-16.

FIGS. 2A-8A are diagrammatic fragmentary top views of a FinFET device 100 at various stages of fabrication, and FIGS. 2B-8B are diagrammatic cross-sectional side views of the FinFET device 100 at various stages of fabrication. The cross-sectional views are obtained along the Y-cut shown in FIG. 1, and the Y-cut is also illustrated in the top view of FIG. 2A.

Figure 2A:
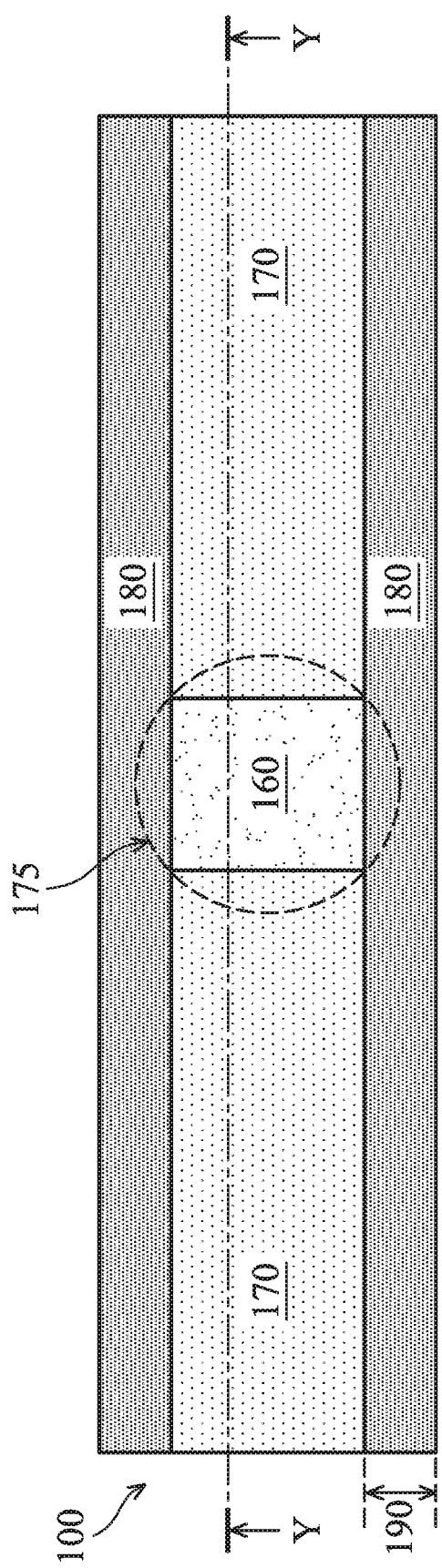
Figure 2B:
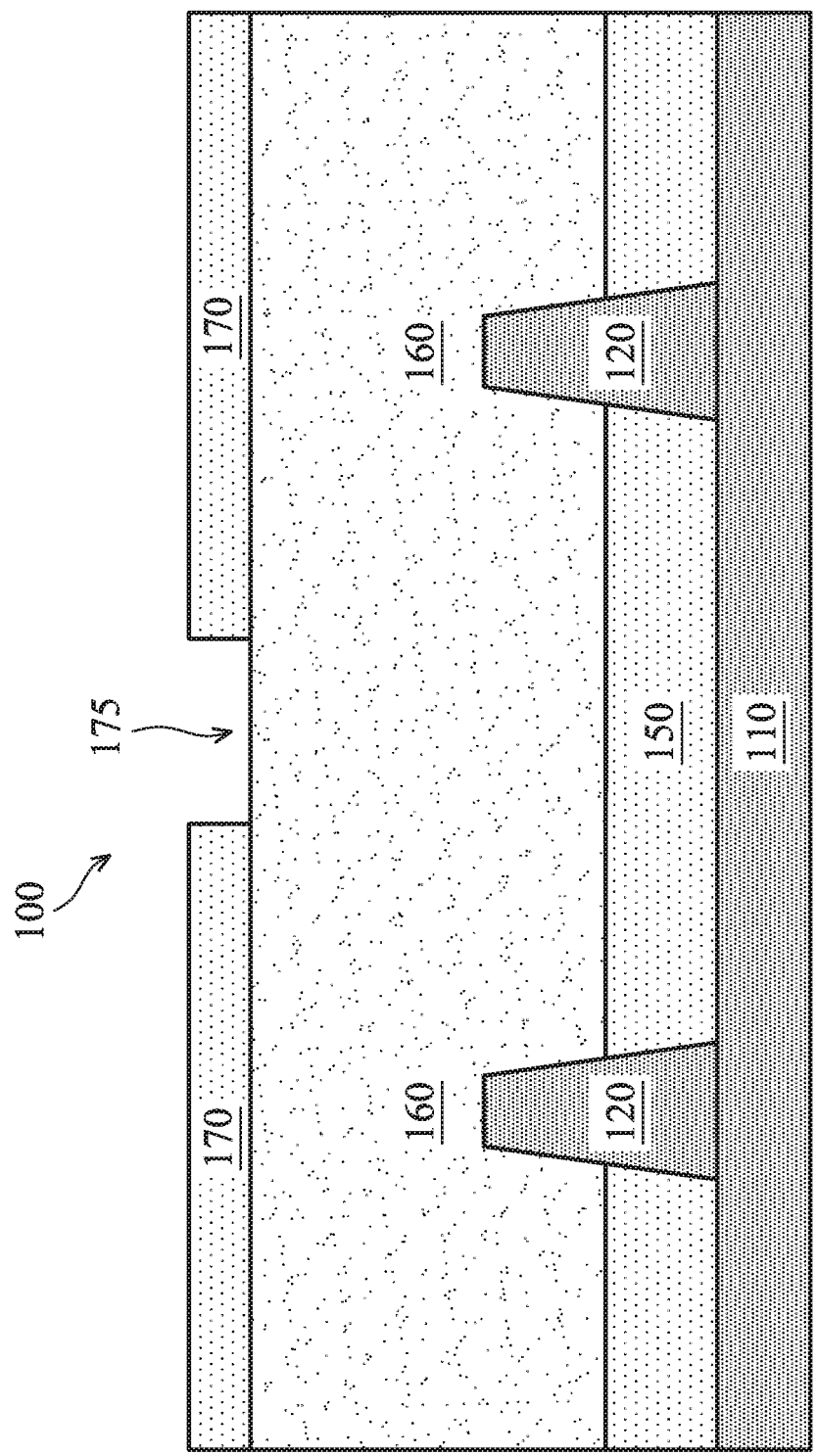

Referring to FIG. 2B, the FinFET device 100 includes a substrate 110. The substrate 110 may be a semiconductor substrate, for example a silicon substrate in some embodiments. The substrate 110 may also include a doped well, which may be formed using one or more ion implantation processes that implant dopant ions into the substrate 110. The dopant ions may include an n-type material in some embodiments, for example arsenic (As) or phosphorous (P), or they may include a p-type material in some other embodiments, for example boron (B), depending on whether an NFET or a PFET is needed.

The FinFET device 100 includes fin structures 120 that protrude upwardly out of the substrate 110, for example vertically upward in the Z-direction shown in FIG. 1. Also while it is not immediately visible in FIG. 2B, the fin structures 120 are elongated structures and each extend in the X-direction, similar to the fin structure in FIG. 1. Various portions of the fin structures 120 may serve as the source/drain regions or channel regions of FinFET transistors. Also as shown in FIG. 2B, the fin structures 120 are partially surrounded by (or embedded within) an isolation structure 150. In some embodiments, the isolation structure 150 includes shallow trench isolation (STI). The isolation structure 150 provides electrical isolation between various components of the FinFET device 100, for example the fin structures 120.

A dummy gate layer 160 is formed over the isolation structure 150. The dummy gate layer 160 also is formed over, and partially wraps around, portions of the fin structures 120. In some embodiments, the dummy gate layer 160 includes polysilicon. The dummy gate layer 160 will be patterned into dummy gate structures subsequently and will be removed and replaced by high-k metal gates in a gate replacement process performed later.

As shown in FIG. 2A-2B, a patterned mask layer 170 is formed over the dummy gate layer 160. In some embodiments, the patterned mask layer 170 includes a dielectric material such as silicon oxynitride (SiON). The patterned mask layer 170 will serve as a hard mask in a patterning process discussed below. The patterned mask layer 170 includes an opening 175. The opening 175 may be defined by forming a mask layer material and forming a patterned photoresist layer, and using the patterned photoresist layer to etch the opening into the mask layer material. The opening 175 will be extended further into the dummy gate layer 160 in a subsequent process discussed below.

As shown in the top view of FIG. 2A, gate spacers 180 are formed on either sides of the dummy gate layer 160, as shown in FIG. 2A. The gate spacers 180 are not directly visible in the cross-sectional view of FIG. 2B (or any of the cross-sectional view figures in the subsequent fabrication processing stages), since the cut-line Y-Y is taken at a location outside of the gate spacers 180. The gate spacers 180 include a dielectric material, which may be different from the material of the patterned mask layer 170. In various embodiments, the gate spacers 180 may include silicon nitride (SiN), silicon oxynitride (SiON), silicon oxycarbonitride (SiOCN), silicon carbide (SiC), silicon oxycarbide (SiOC), or combinations thereof. The gate spacers 180 each have a lateral dimension 190 that is measured in the X-direction (e.g., the X-direction shown in FIG. 1). In some embodiments, the lateral dimension 190 is in a range between about 5 angstroms and about 500 angstroms.

Figure 3A:
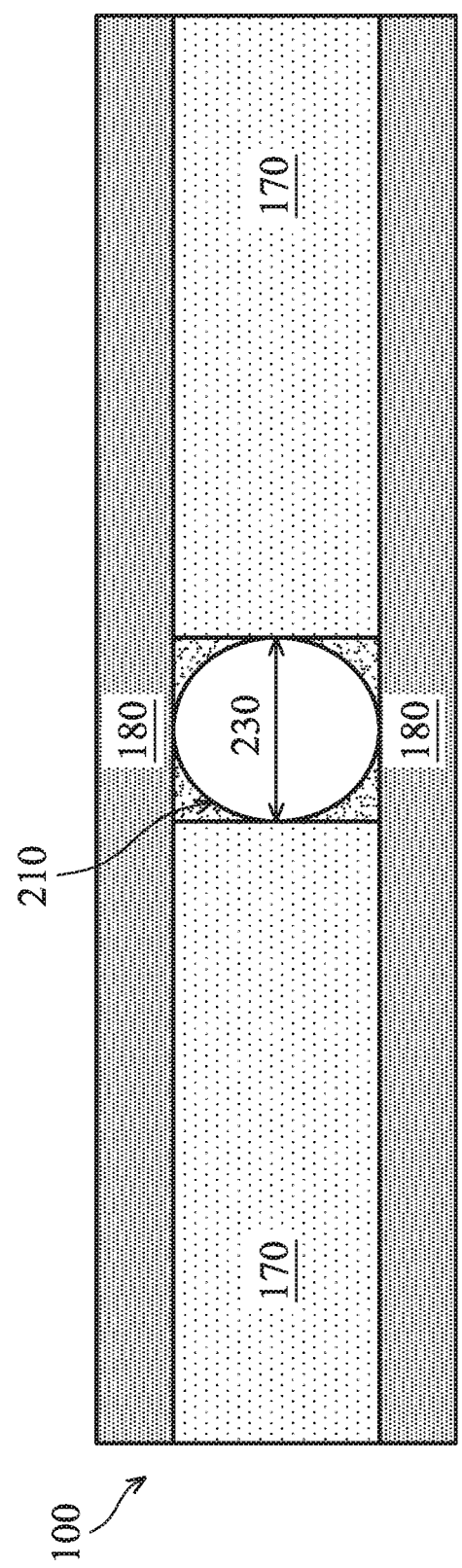
Figure 3B:
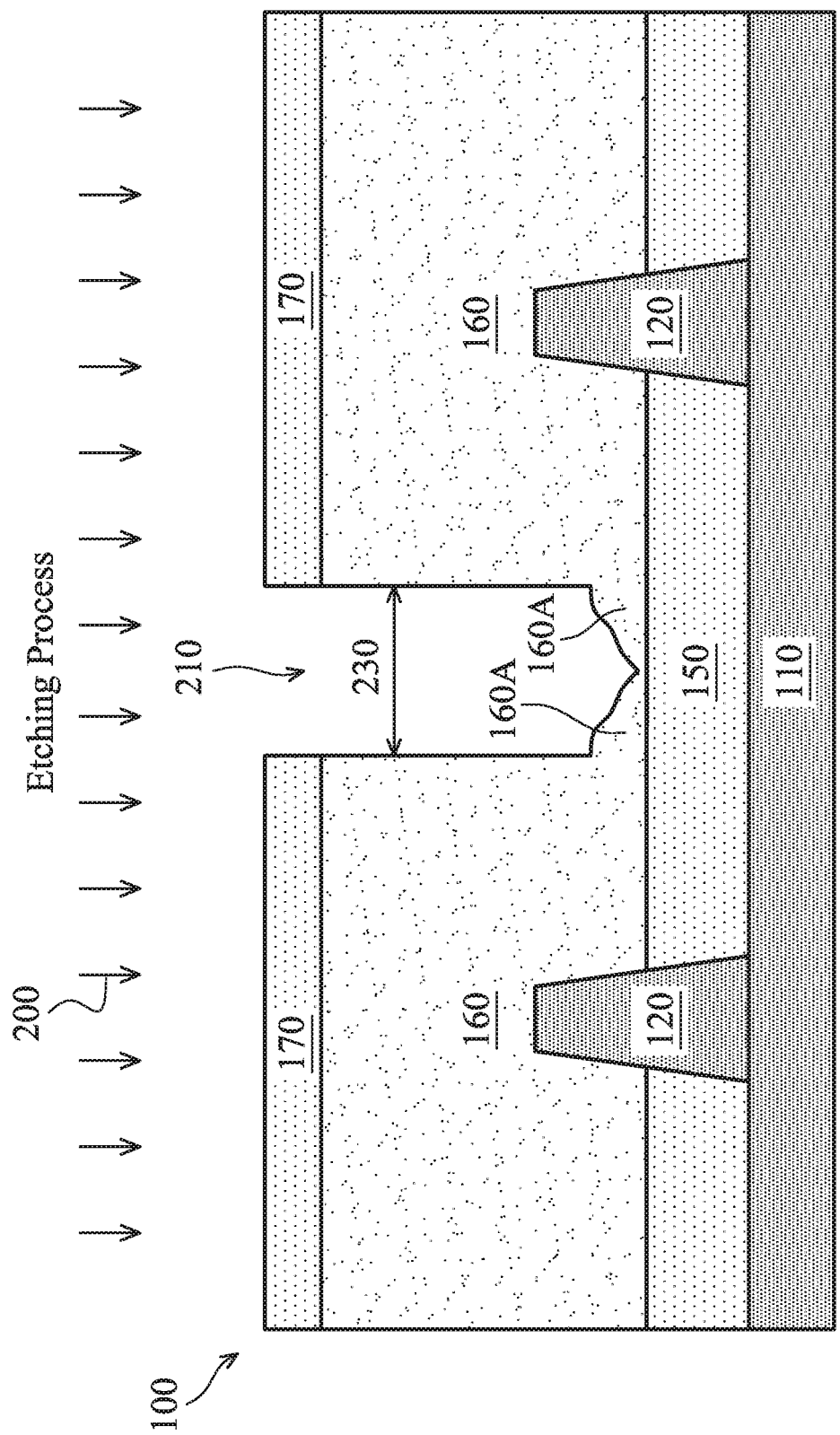

Referring now to FIGS. 3A-3B, an etching process 200 is performed to the FinFET device 100 to further etch the opening 175 into the dummy gate layer 160. As a result, the opening 175 of the patterned mask layer 170 becomes an opening (or recess) 20 that extends vertically through the dummy gate layer 160 in the Z-direction (e.g., the Z-direction shown in FIG. 1). The etching process 200 may also be referred to as a cut-poly etching process, since it "cuts open" the dummy gate layer 160 (which contains polysilicon in the illustrated embodiment. The dummy gate layer 160 is now separated into individual dummy gate structures 160.

As shown in FIGS. 3A-3B, the opening 210 has a dimension 230 that is measured in the Y-direction. The dimension 230 is one of the critical dimensions (CD) of the FinFET device 100. In some embodiments, the dimension 230 is in a range between about 3 nanometers (nm) and about 50 nm.

As discussed above, due to the ever-shrinking geometry sizes in semiconductor fabrication, the dimension 230 may be small enough to cause problems related to the etching process 200. For example, due to the small size of the dimension 230, the etching process 200 may not be able to completely remove the dummy gate layer 160 as intended. In some cases (such as the case illustrated in FIG. 3B), some remnants 160A of the dummy gate layer 160 may remain at the bottom of the dummy gate layer 160. Due to the removed remnants 160A, the dummy gate layer 160 may also be referred to as having a "footing" profile. The remnants 160A of the dummy gate layer 160 may even come into contact with each other. This may in turn lead to bridging between adjacent high-k metal gates when a gate replacement process is performed later to replace the dummy gates 160 with the high-k metal gates. The bridging of the high-k metal gates would decrease device yield and/or degrade device performance. Making matters worse, these problems are usually not detected until the fabrication of the FinFET device 100 has been mostly completed, at which point it may be too late to take any remedial measures.

Figure 4B:
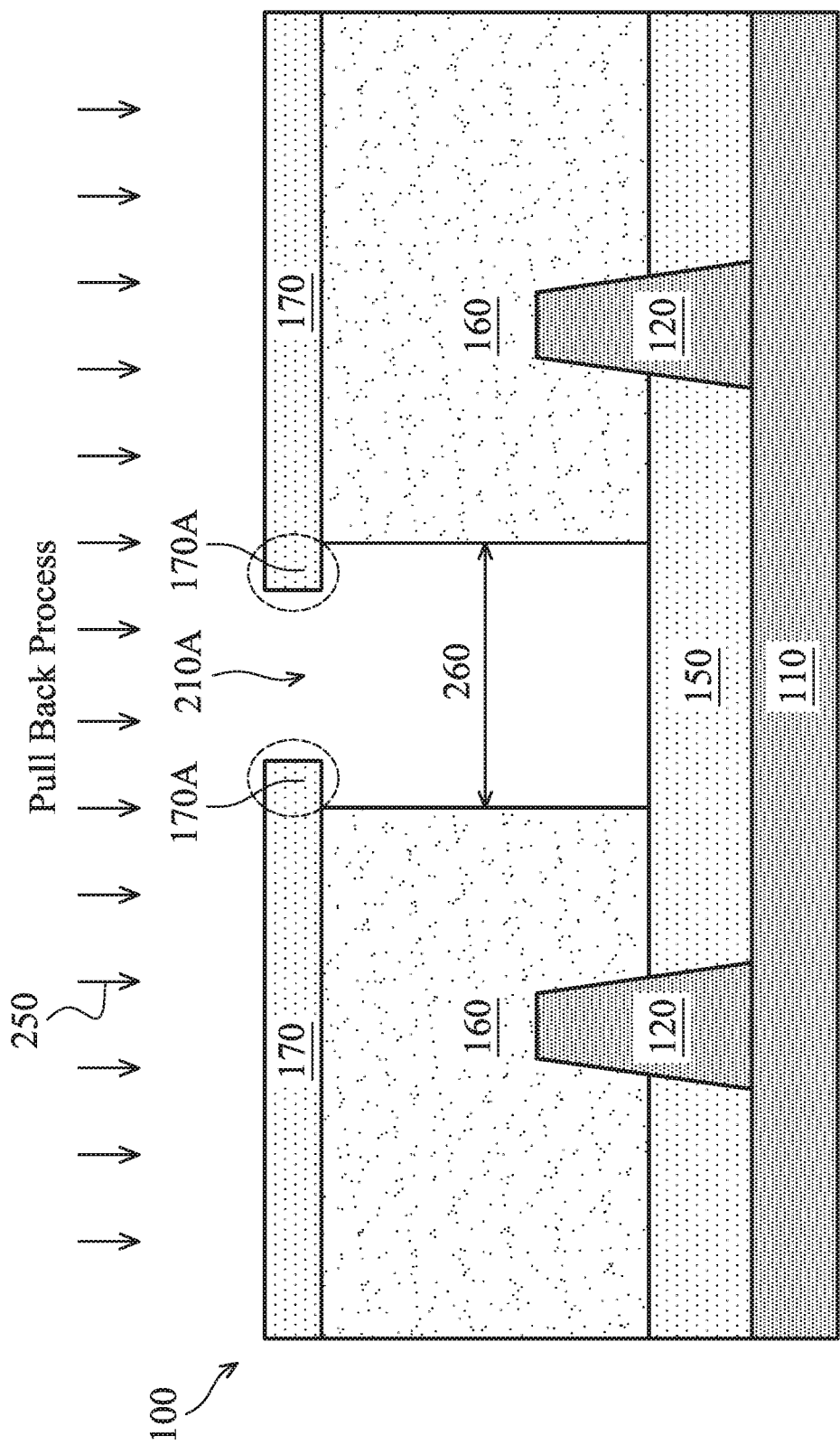

In order to fix this problem discussed above, a "pull back" process 250 is performed to widen the opening 210 (i.e., to increase the dimension 230), as shown in FIGS. 4A-4B. The pull back process 250 may include a lateral etching process to etch away portions of the dummy gate layer 160 that are exposed by the opening 210. In some embodiments, the "pull back" process 250 uses an etchant that includes $H_2$, He, $Cl_2$, $N_2$, Ar, $O_2$, $NF_3$, $CH_4$, $CH_xF_y$ (where x and y may be integers), HBr, or combinations thereof. In some embodiments, the "pull back" process 250 is performed using: a power that is in a range between about 200 watts and about 1500 watts, a bias that is in a range between about 500 volts and about 2000 volts, a pressure that is in a range between about 3 milli-Torrs about 100 milli-Torrs, and a process time that is in a range between about 5 seconds and about 50 seconds.

As a result of the pull back process 250, the opening 210 is widened into an opening 210A, which now has a lateral dimension 260 that is measured in the Y-direction. The lateral dimension 260 is greater than the lateral dimension 230 shown in FIGS. 3A-3B. In some embodiments, the lateral dimension 260 is in a range between about 5 nanometers and about 50 nm. The lateral dimension 260 may be configured by tuning the various parameters of the pull back process 250. In some embodiments, the pull back process 250 substantially removes the remnants 160A (e.g., the footing profile of the dummy gate layer 160), or at least reduces the sizes of the remnants 160A, such that they are no longer at risk of bridging into adjacent remnants. As such, when the gate replacement process is performed later, the risks of bridging between the adjacent high-k metal gates will be substantially reduced. Hence, the present disclosure may relax the process windows herein (such as for the "cut" process discussed above) and does not place stringent requirements on the pitch and/or space requirements on the "cut" dummy gate layer 160.

Note that the pull back process 250 does not substantially affect the patterned mask layer 170. This may be achieved by configuring the lateral etching process parameters of the pull back process 250 such that a sufficiently high etching selectivity exists between the patterned mask layer 170 and the dummy gate layer 160. Consequently, portions of the patterned mask layer 170 may form "overhangs" 170A over the opening 210A, as shown in FIG. 4B. The presence of these overhangs 170A help form an air gap in a dielectric material between the adjacent gate structures, as discussed below in more detail.

Figure 5A:
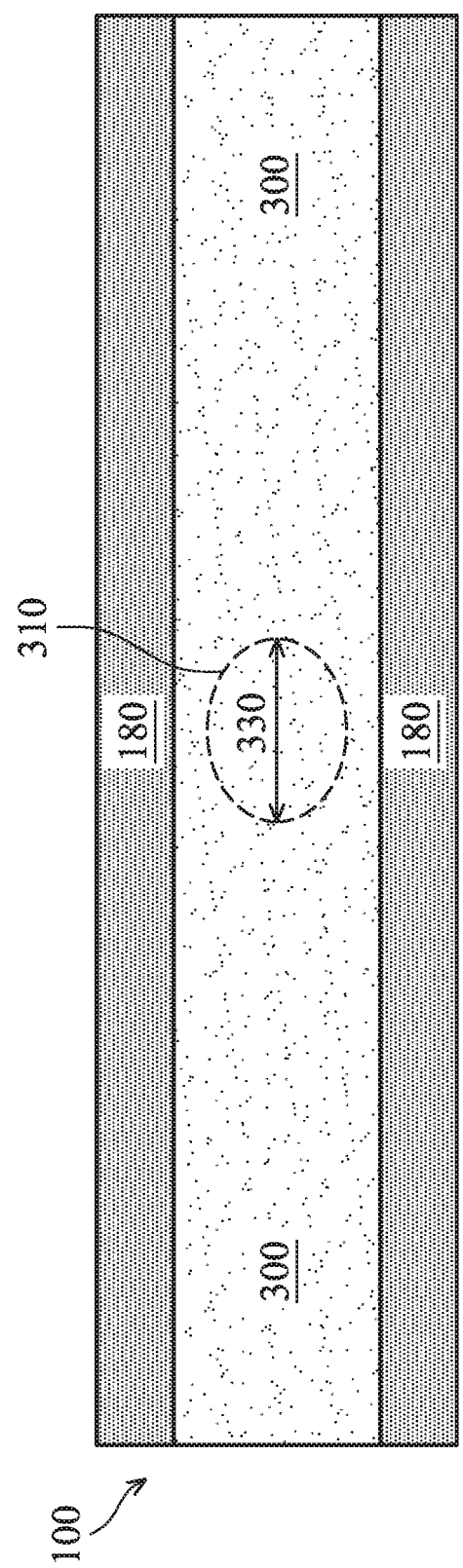
Figure 5B:
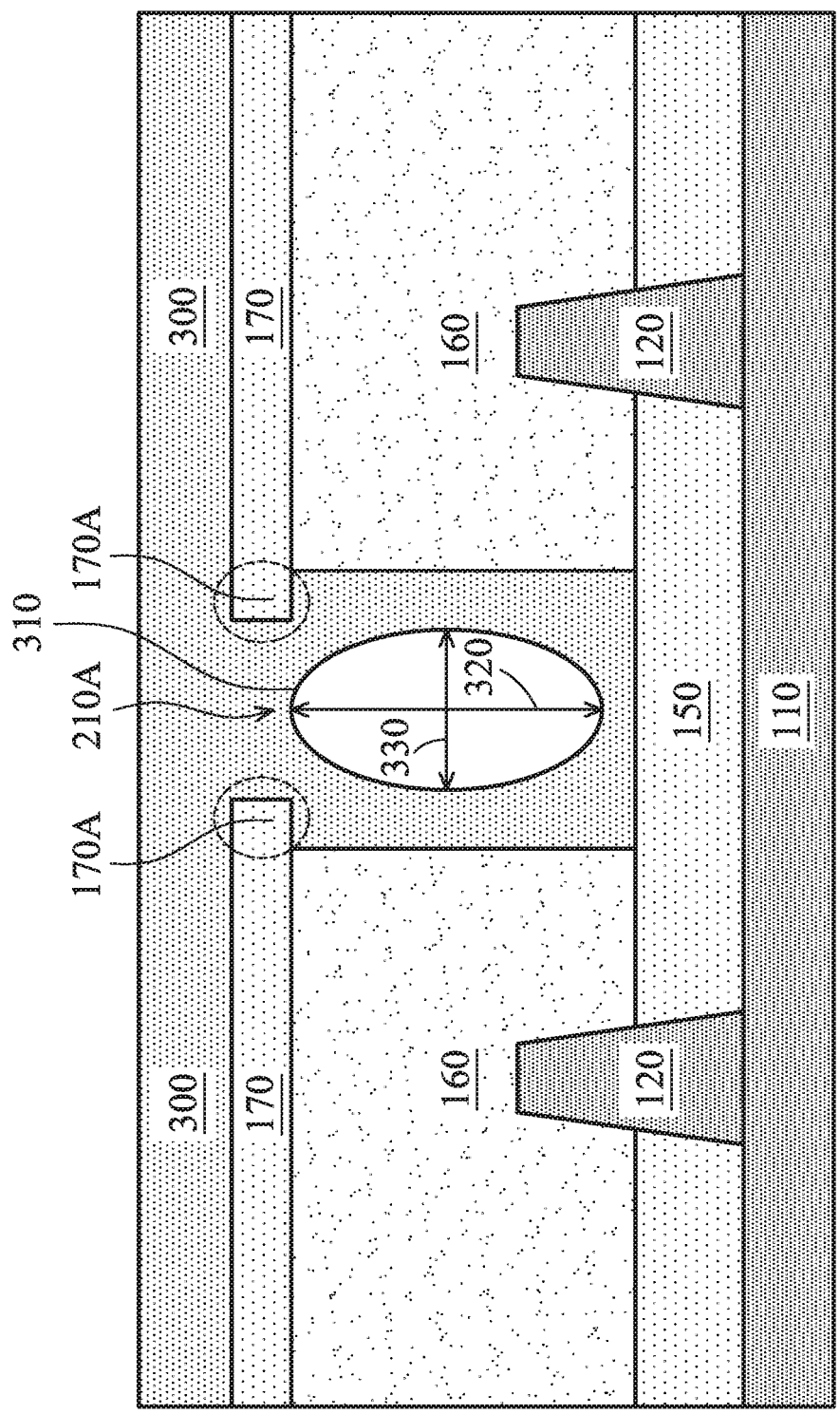

Referring now to FIGS. 5A-5B, a dielectric material 300 is formed over the mask layer 170 and over the isolation structure 150. In some embodiments, the dielectric material 300 may be formed by a deposition process, such as chemical vapor deposition (CVD), physical vapor deposition (PVD), atomic layer deposition (ALD), or combinations thereof. The dielectric material 300 may have a different material composition than the patterned mask layer 170 and/or than the gate spacers 180. In some embodiments, the dielectric material 300 includes silicon nitride. In other embodiments, the dielectric material 300 may include silicon oxynitride, silicon oxycarbonitride, silicon carbide, silicon oxycarbide, silicon oxide, or combinations thereof.

The dielectric material 300 also partially fills the opening 210A. Due to the presence of the overhangs 170A of the patterned mask layer 170, a void or air gap 310 is formed in the dielectric material 300 and between the adjacent dummy gate structures 160. The air gap 310 has a vertical dimension 320 (measured in the Z-direction) and a lateral dimension 330. In some embodiments, the vertical dimension 320 is in a range between about 10 nm and about 50 nm, and the horizontal dimension 330 is in a range between about 1 nm and about 10 nm. These ranges may be specifically configured by adjusting the process parameters of the lateral etching process and the dielectric material deposition process discussed above. It is understood that the air gap 310 is not directly visible in the top view of FIG. 5A. However, for the sake of providing a better understanding of the present disclosure, the outline of the air gap 310 is illustrated in FIG. 5A as a dashed contour.

Figure 6A:
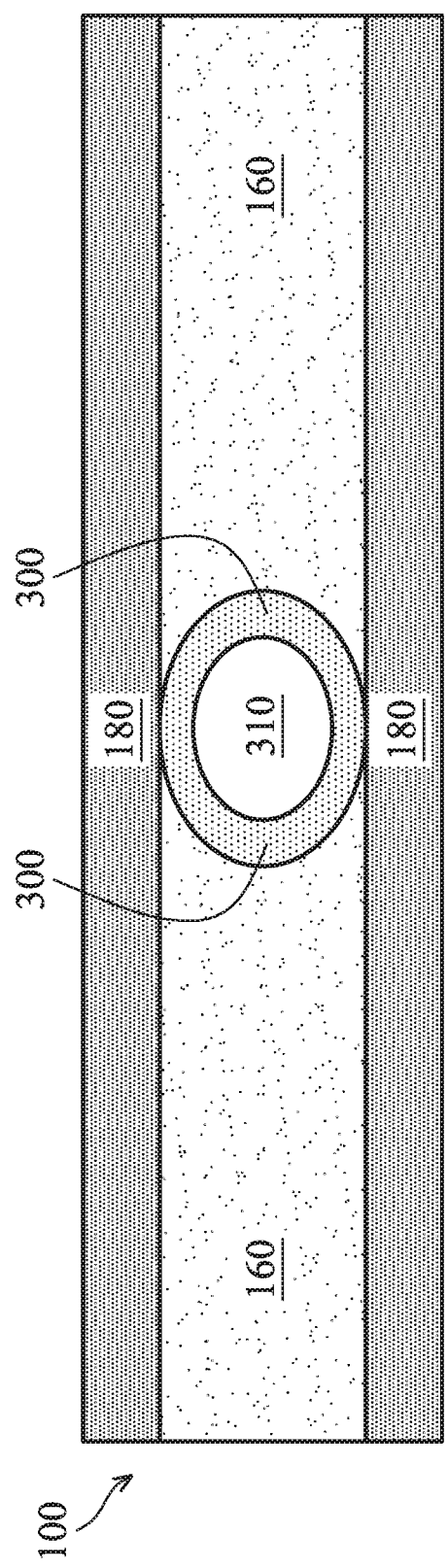
Figure 6B:
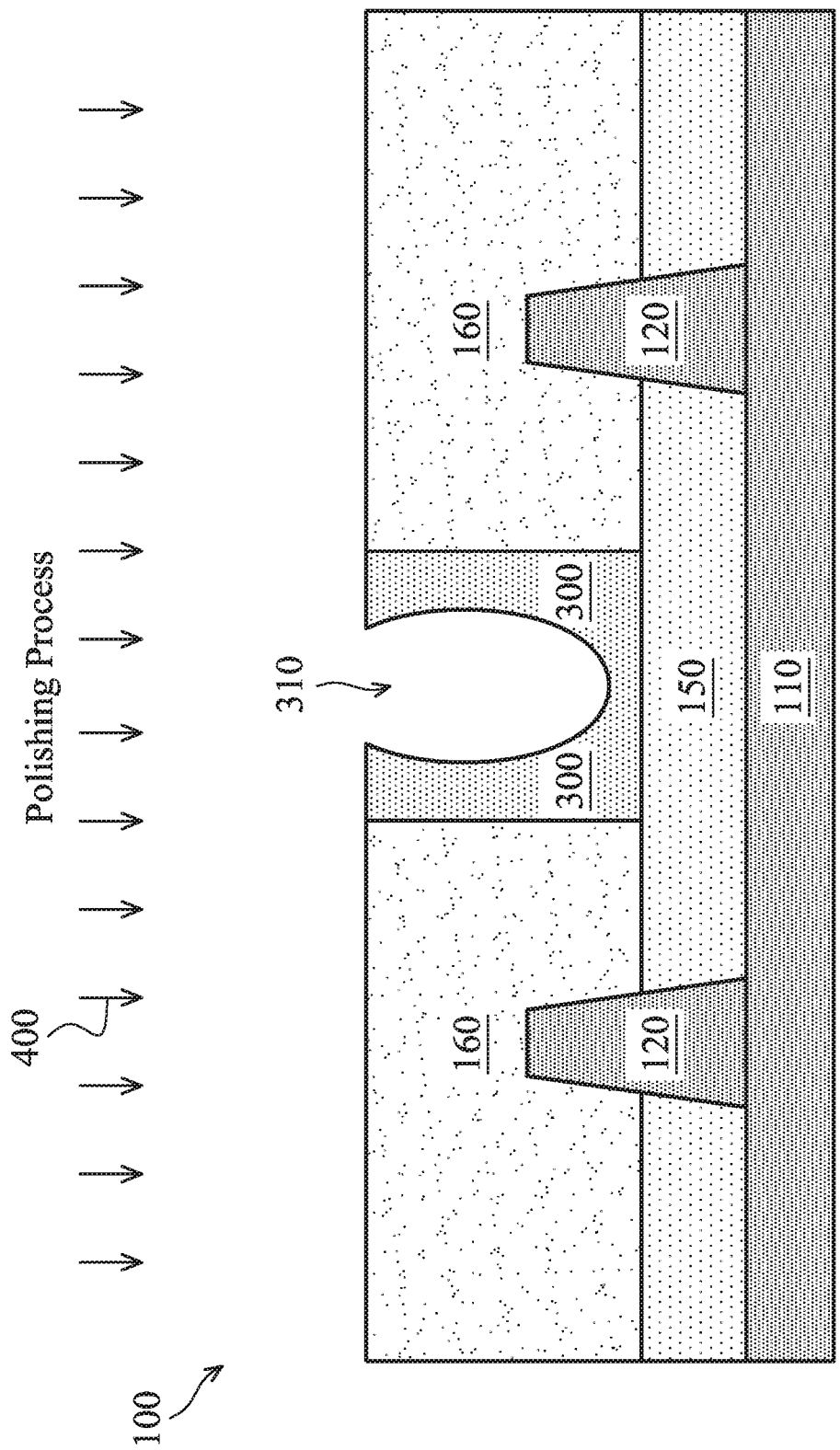

Referring now to FIGS. 6A-6B, a polishing process 400 is performed to the FinFET device 100 to remove the patterned mask layer 170 and portions of the dielectric material 300, as well as to planarize the upper surface of the FinFET device 100. In some embodiments, the polishing process 400 includes a chemical mechanical polishing (CMP) process. Some upper portions of the dummy gate structures 160 may also be removed by the polishing process 400. The polishing process 400 may also remove a sufficient amount of the dielectric material 300 such that the air gap 310 is "opened up." In other words, the air gap 310 is exposed as a result of the polishing process 400 being performed.

Figure 7A:
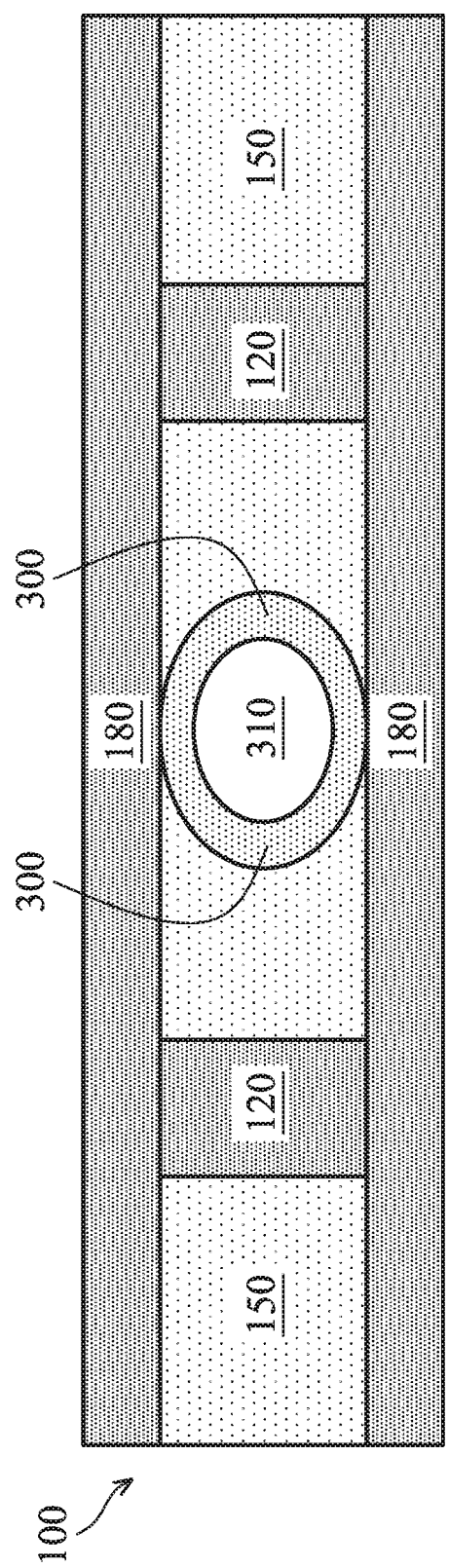
Figure 7B:
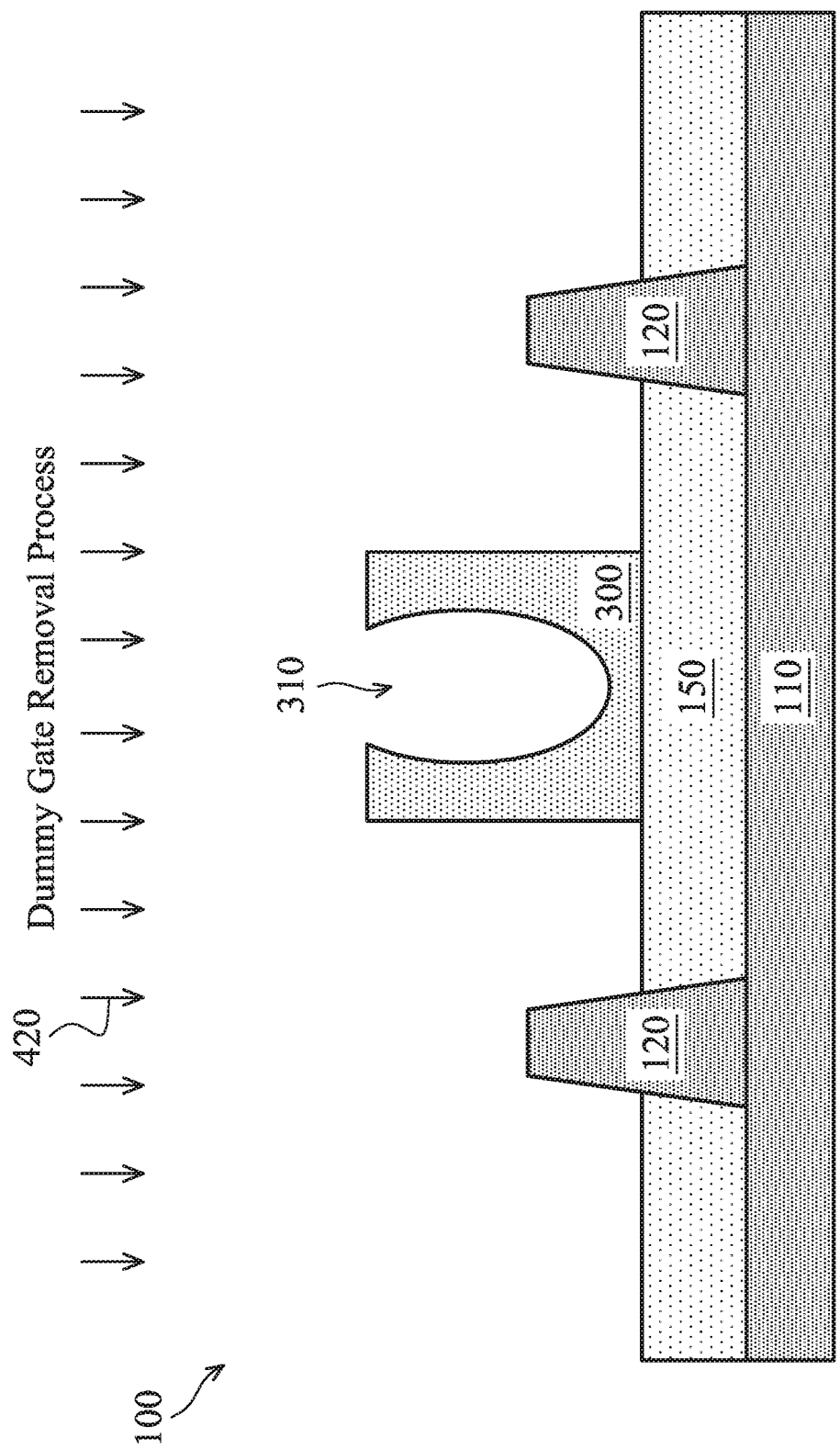

Referring now to FIGS. 7A-7B, a dummy gate removal process 420 is performed to the FinFET device 100 to remove the dummy gate structures 160. In some embodiments, the dummy gate removal process 420 may include one or more etching processes configured to remove the polysilicon material of the dummy gate structures 160. The etching processes may be configured to have an etching selectivity between the dummy gate structures 160 and the dielectric material 300. Thus, the removal of the dummy gate structures 160 does not substantially affect the dielectric material 300. Hence, after the removal of the dummy gate structures 160, the air gap 310 is still defined by the remaining portions of the dielectric material 300. It is also understood that the upper portions of the fin structures 120 and regions of the isolation structures 150 may also be exposed after the removal of the dummy gate removal process 420 is performed.

Figure 8A:
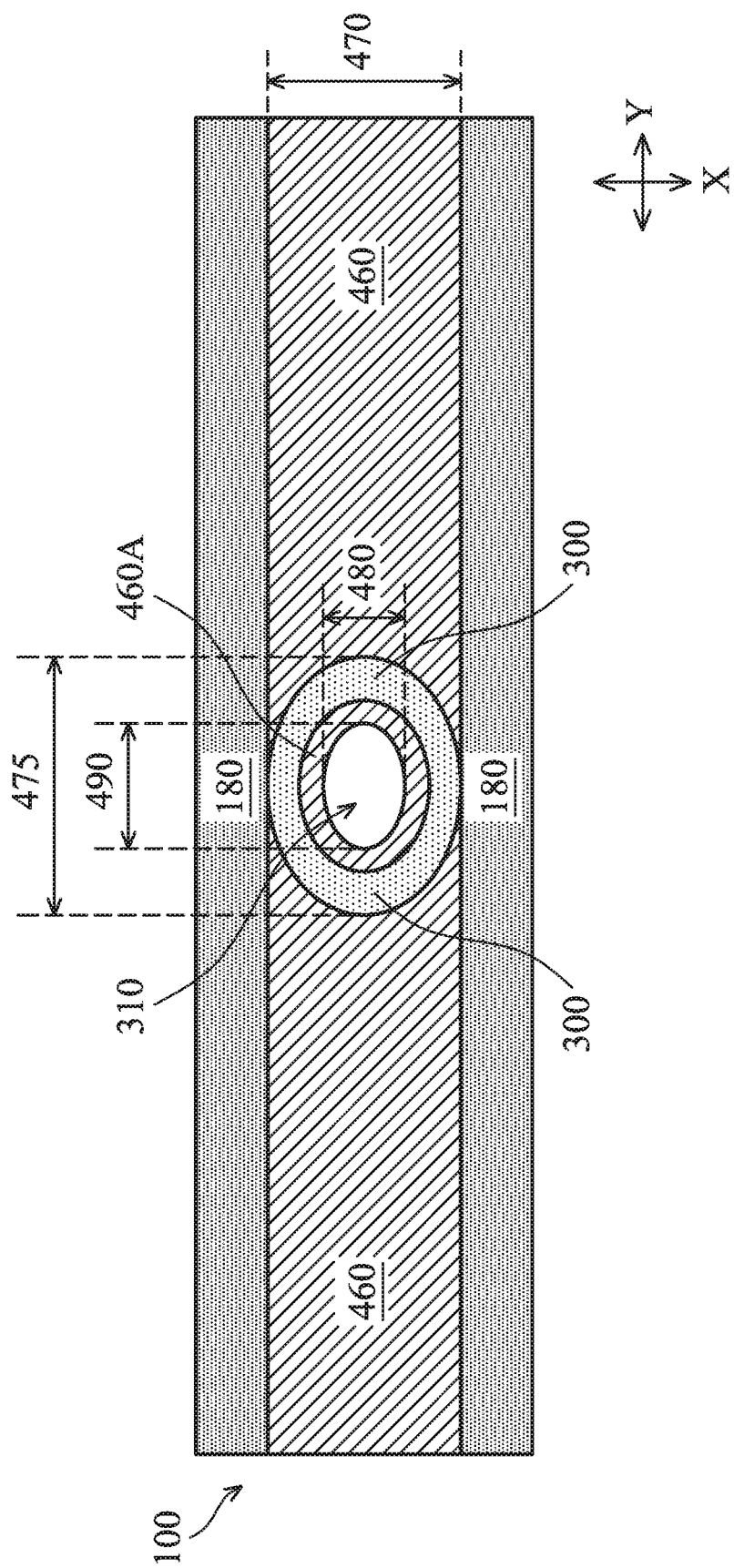
Figure 8B:
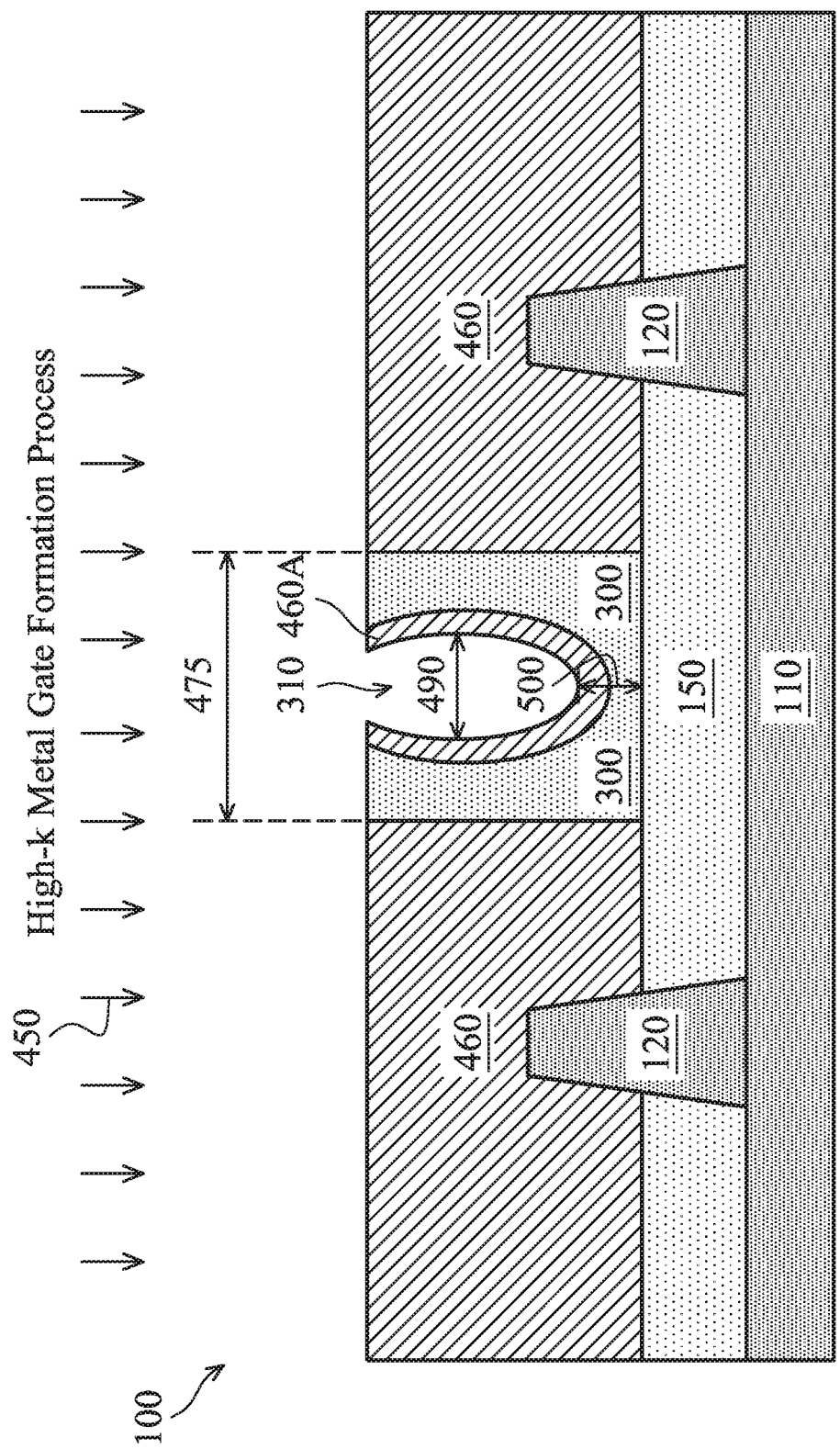
Figure 9:
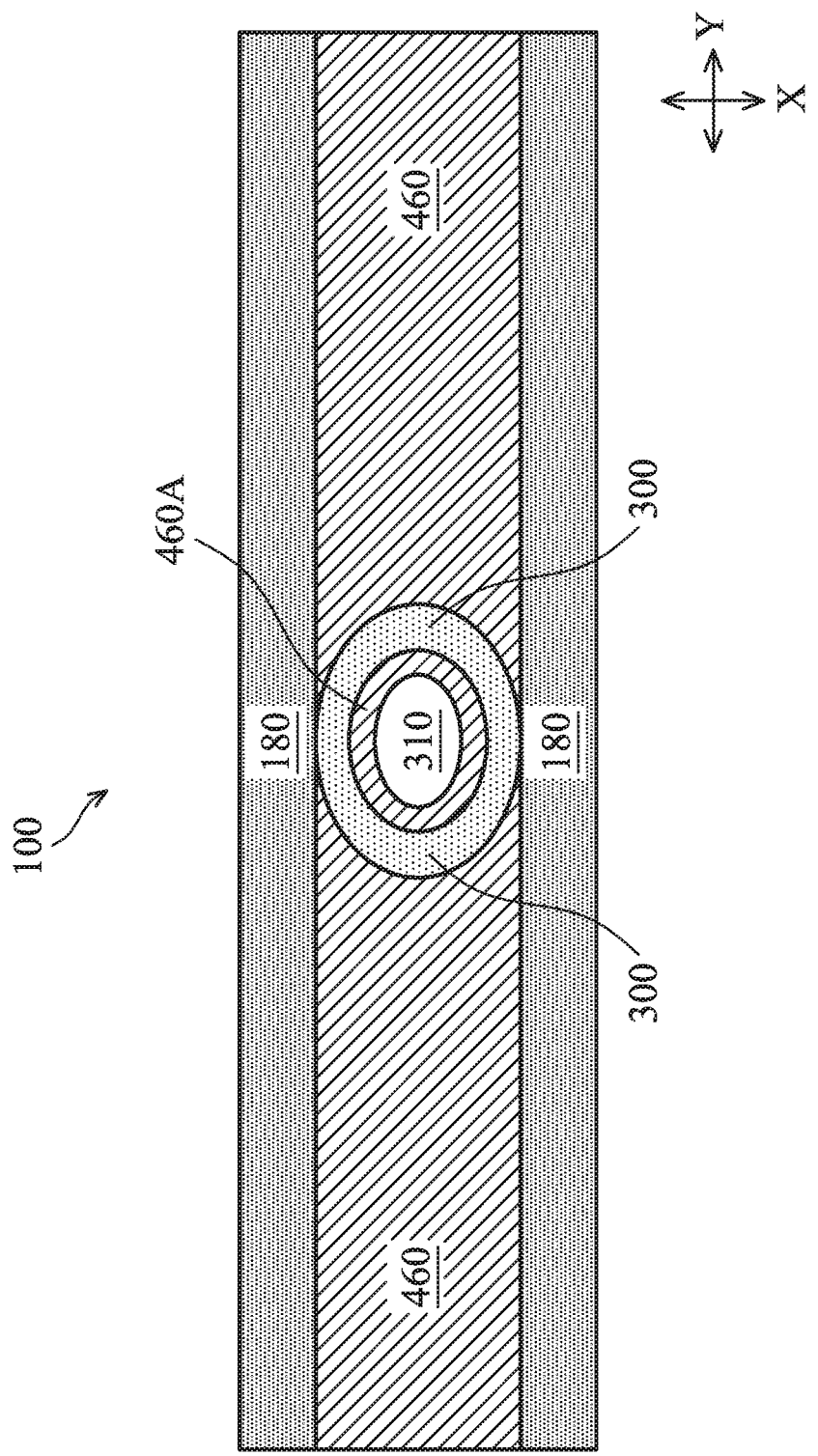
FIGS. 9-12 illustrate top views of an air gap according to various embodiments of the present disclosure.

Referring now to FIGS. 8A-8B, a high-k metal gate formation process 450 is performed to form high-k metal gate structures 460 in replace of the removed dummy gate structures 160. As such, the high-k metal gate structures 460 are formed over the isolation structures 150 and wrap around the fin structures 120. It is understood that the high-k metal gate structures 460 are elongated structures, and they each extend in the Y-direction, similar to the gate structure in FIG. 1. In other words, the high-k metal gate structures 460 and the fin structures 120 extend in different directions, for example in directions that are perpendicular to one another.

Adjacent high-k metal gate structures 460 (e.g., adjacent to one another in the Y-direction) are separated from one another in the Y-direction by the remaining portions of the dielectric material 300 and the air gap 310. Stated differently, the adjacent high-k metal gate structures 460 are formed on opposite sides of the air gap 310. The dielectric material 300 and the air gap 310 will provide electrical isolation between the high-k metal gate structures 460.

The high-k metal gate structures 460 each include a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode may include a work function metal component and a fill metal component. The work functional metal component is configured to tune a work function of its corresponding FinFET to achieve a desired threshold voltage Vt. In various embodiments, the work function metal component may contain: titanium (Ti), titanium aluminum (TiAl), titanium aluminum nitride (TiAlN), tantalum (Ta), tantalum carbide (TaC), tantalum carbon nitride (TaCN), tantalum silicon nitride (TaSiN), tantalum nitride (TaN), titanium nitride (TiN), tungsten nitride (WN), or tungsten (W), cobalt (Co), nickel (Ni), manganese (Mn), zirconium (Zr), or combinations thereof. The fill metal component is configured to serve as the main conductive portion of the functional gate structure 460. In various embodiments, the fill metal component may contain aluminum (Al), tungsten, copper (Cu), aluminum copper (AlCu), or combinations thereof. In some embodiments, the high-k dielectric and the various metal layers of the high-k metal gate structures 460 may each be formed by one or more suitable deposition processes. A polishing process such as a CMP process may also be performed to planarize the upper surface of the high-k metal gate structures 460.

As shown in FIG. 8A, the high-k metal gate structure 460 has a dimension 470 that is measured in the X-direction. The dimension 470 may be referred to as a critical dimension (CD) of the high-k gate structure 460 in the X-direction. In some embodiments, the dimension 470 is in a range between about 5 nm and about 50 nm. It is understood that the dimension 470 may correspond to Lg shown in FIG. 1.

Also as shown in FIGS. 8A-8B, a distance 475 separates the adjacent gate structures 460. The distance 475 is measured in the Y-direction. The distance 475 may be referred to as a "cut" critical dimension (CD). This is because the distance 475 is mostly defined by the etching process 200 performed to "cut open" the dummy gate layer 160 (as discussed above with reference to FIGS. 3A-3B), as well as by the "pull back" process 250 to widen the "cut" (as discussed above with reference to FIGS. 4A-4B). Accordingly, the distance 475 may be approximately equal to the lateral dimension 260 shown in FIGS. 4A-4B. In some embodiments, the distance 475 is in a range between about 5 nm and about 50 nm.

In some embodiments, because the air gap 310 had been exposed, portions 460A of the high-k metal gate structures may be formed within the air gap 310 as well. Alternatively, the portions 460A may be viewed as being formed within the dielectric material 300, and that they define the outer boundaries of the air gap 310, which is now shrunk in size due to the deposited portions 460A. Similar to the high-k metal gate structures 460, the portions 460A may include a high-k gate dielectric material and a metal gate material. However, unlike the high-k metal gate structures 460, the portions 460A formed in the air gap 310 do not function as a gate of a transistor. The thickness of the portions 460A may depend on the size of the air gap 310. The smaller the air gap 310, the thinner the thickness of the portions 460A. In the embodiment shown in FIGS. 8A-8B, the portions 460A partially fill the air gap 310. In some other embodiments, no portions 460A may be formed to substantially (or even completely) fill the air gap 310.

As is shown in FIG. 8A, the air gap 310 has a maximum dimension 480 that is measured in the X-direction and a maximum dimension 490 that is measured in the Y-direction. The maximum dimension 480 may be referred to as a critical dimension (CD) of the air gap 310 in the X-direction, whereas the maximum dimension 490 may be referred to as a critical dimension (CD) of the air gap 310 in the Y-direction. In some embodiments, the maximum dimension 480 is in a range between about 1 nm and about 10 nm, and the maximum dimension 480 is in a range between about 1 nm and about 10 nm. However, it is understood that the maximum dimension 480 and the maximum dimension 490 may be different from each other in value (e.g., one may be greater than the other).

Also as is shown in FIG. 8B, the air gap 310 may have a height 500 (also referred to as a depth) that is measured in the Z-direction (e.g., the Z-direction shown in FIG. 1). The height 500 may be measured as a distance between an upper surface of the isolation structure 150 and a bottommost portion of the air gap 310. In some embodiments, the height 500 of the air gap 310 is in a range between about 1 nm and about 100 nm.

It is understood that FIGS. 8A-8B merely illustrate an example embodiment of the present disclosure. As such, the shapes, profiles, and/or the sizes of the air gap 310 shown in FIGS. 8A-8B are merely examples and are not intended to be limiting. FIGS. 9, 10, 11, and 12 illustrate the top views of other embodiments of the present disclosure, where the air gap 310 has different top view profiles and shapes. For example, as shown in the top view of FIG. 9, the air gap 310 and the portions 460A of the high-k and/or metal materials that are formed in the air gap 310 each have a more circular top view profile than the air gap 310 and the portions 460A shown in FIG. 8A, since the air gap 310 and the portions 460A shown in FIG. 8A each have top view profile that resembles an oval, rather than a circle.

Figure 10:
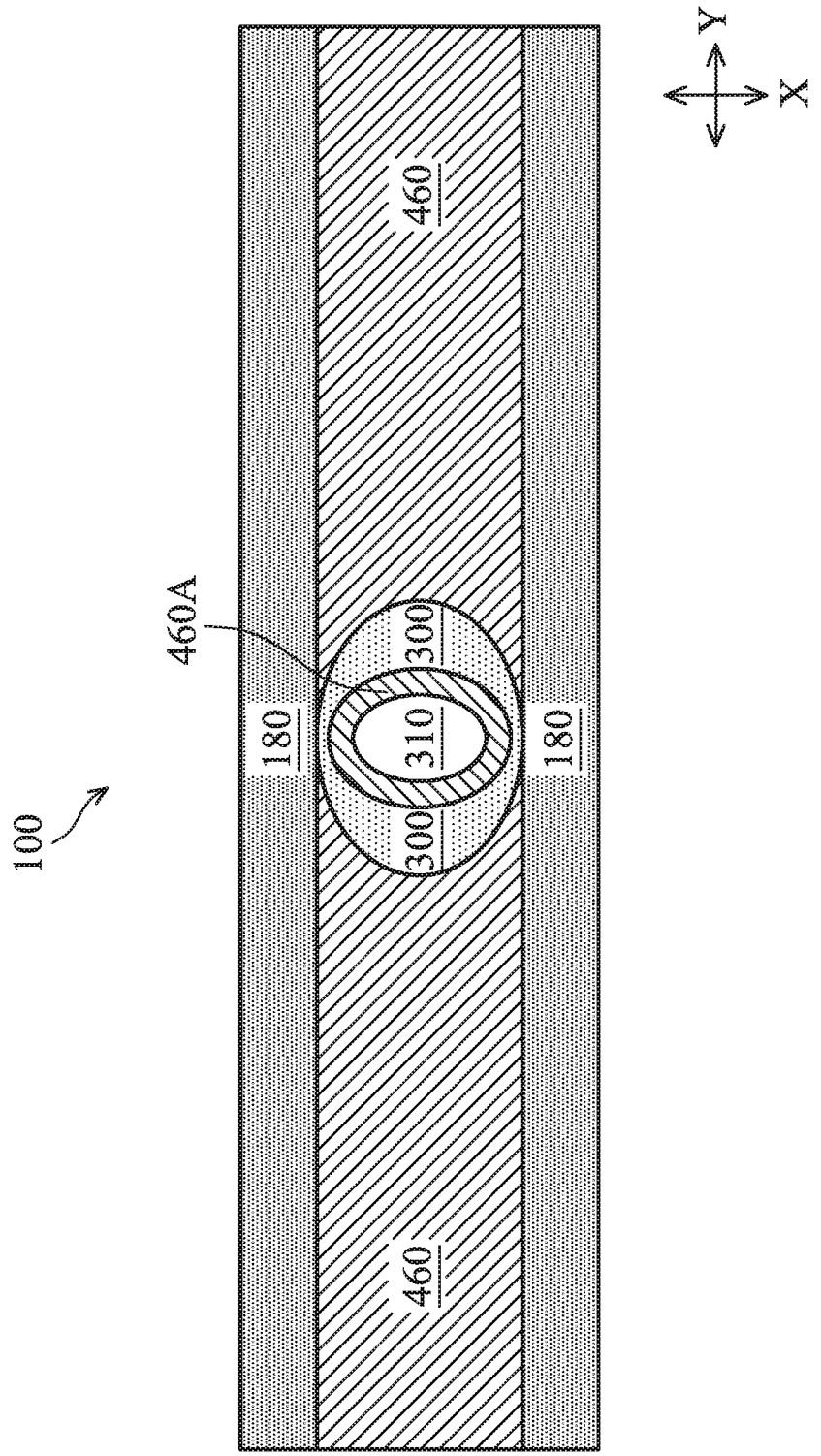

In another example, as shown in the top view of FIG. 10, the air gap 310 and the portions 460A of the high-k and/or metal materials that are formed in the air gap 310 each have an oval-like top view profile. However, unlike the oval-like top view profile of the air gap 310 corresponding to the embodiment shown in FIG. 8A, the air gap 310 corresponding to the embodiment shown in FIG. 10 may be oriented differently. For example, if the air gap 310 of FIG. 8A has a longer dimension measured in the Y-direction (e.g., the dimension 490) and a shorter dimension measured in the X-direction (e.g., the dimension 480), then the air gap 310 of FIG. 10 has a shorter dimension measured in the Y-direction and a longer dimension measured in the X-direction, or vice versa.

Figure 11:
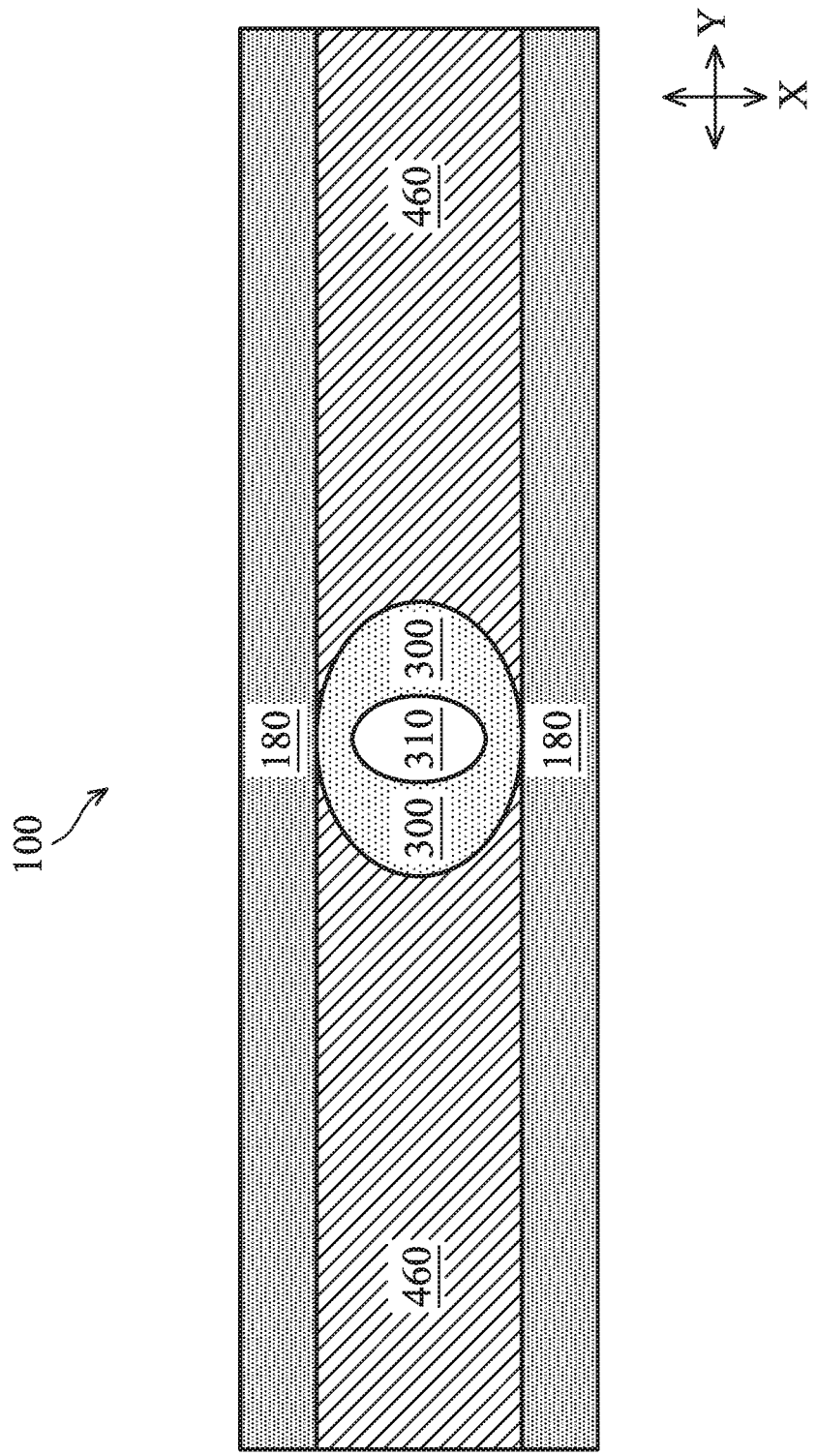

In yet another example, as shown in the top view of FIG. 11, although the air gap 310 is formed between the adjacent gate structures 460, no high-k dielectric and/or metal materials (e.g., the portions 460A shown in FIGS. 8A-8B) are formed in the air gap 310. In other words, when the high-k metal gate structures 460 are formed, for example by a plurality of deposition processes, the deposition processes may not deposit the high-k gate dielectric material and/or the metal gate electrode material in the air gap 310. The absence of the high-k gate dielectric material and/or the metal gate electrode material in the air gap 310 may be a result of the small size of the air gap 310. For example, if the air gap 310 is sufficiently small in the X-direction and/or in the Y-direction, it is difficult for the materials (e.g., the high-k gate dielectric and metal gate materials) to be deposited in the small air gap 310. As a result, the air gap 310 may not have either the high-k gate dielectric material, or the metal gate electrode material, or both.

Figure 12:
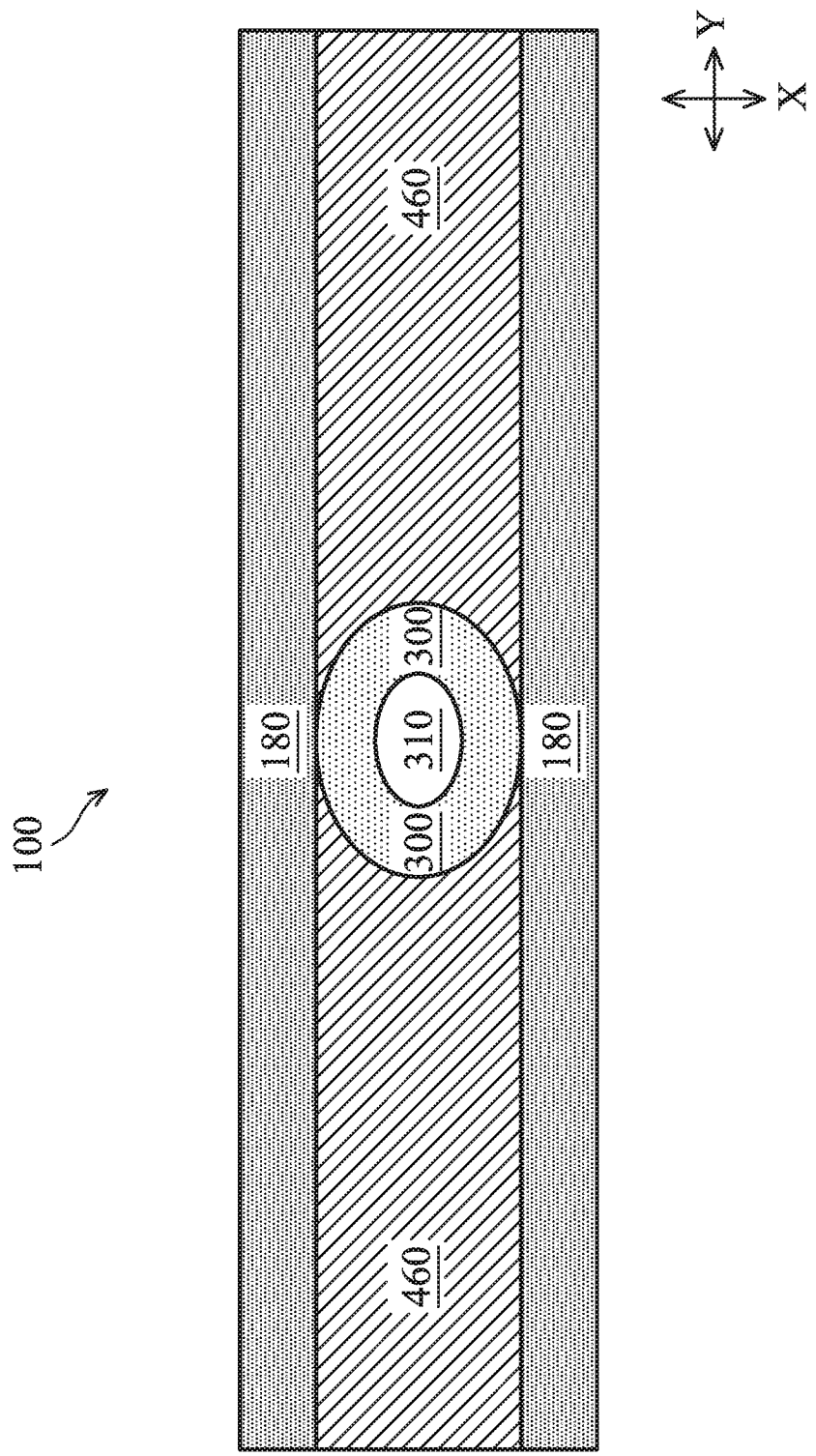

In a further example, as shown in the top view of FIG. 12, the air gap 310 also does not have the high-k gate dielectric material and/or the metal gate electrode material formed within the air gap 310. However, the air gap 310 shown in FIG. 12 may be oriented differently than the air gap 310 shown in FIG. 11. For example, if the air gap 310 of FIG. 11 has a longer dimension measured in the Y-direction and a shorter dimension measured in the X-direction, then the air gap 310 of FIG. 12 has a shorter dimension measured in the Y-direction and a longer dimension measured in the X-direction, or vice versa.

Figure 13:
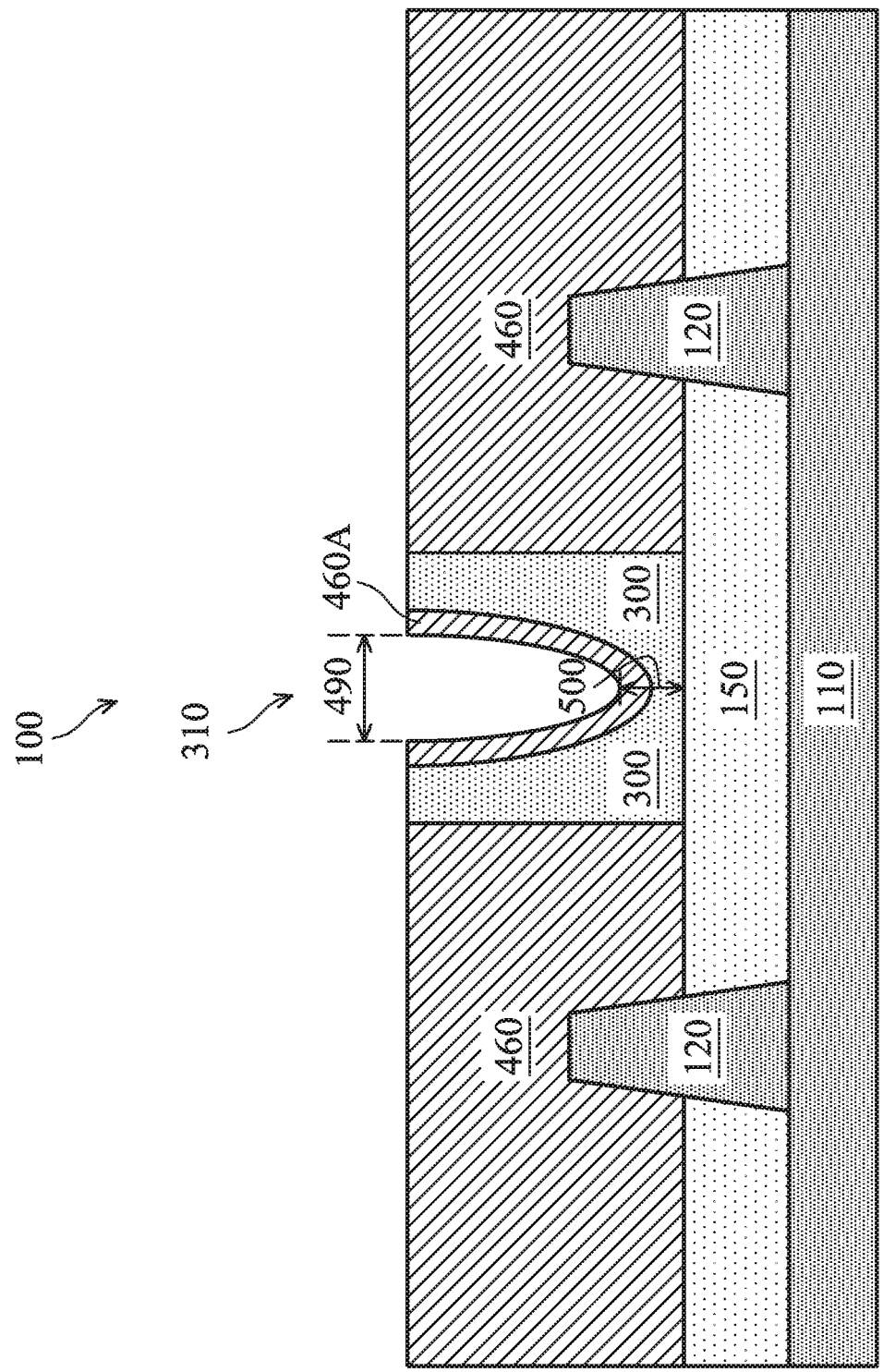
FIGS. 13-15 illustrate cross-sectional side views of an air gap according to various embodiments of the present disclosure.
Figure 14:
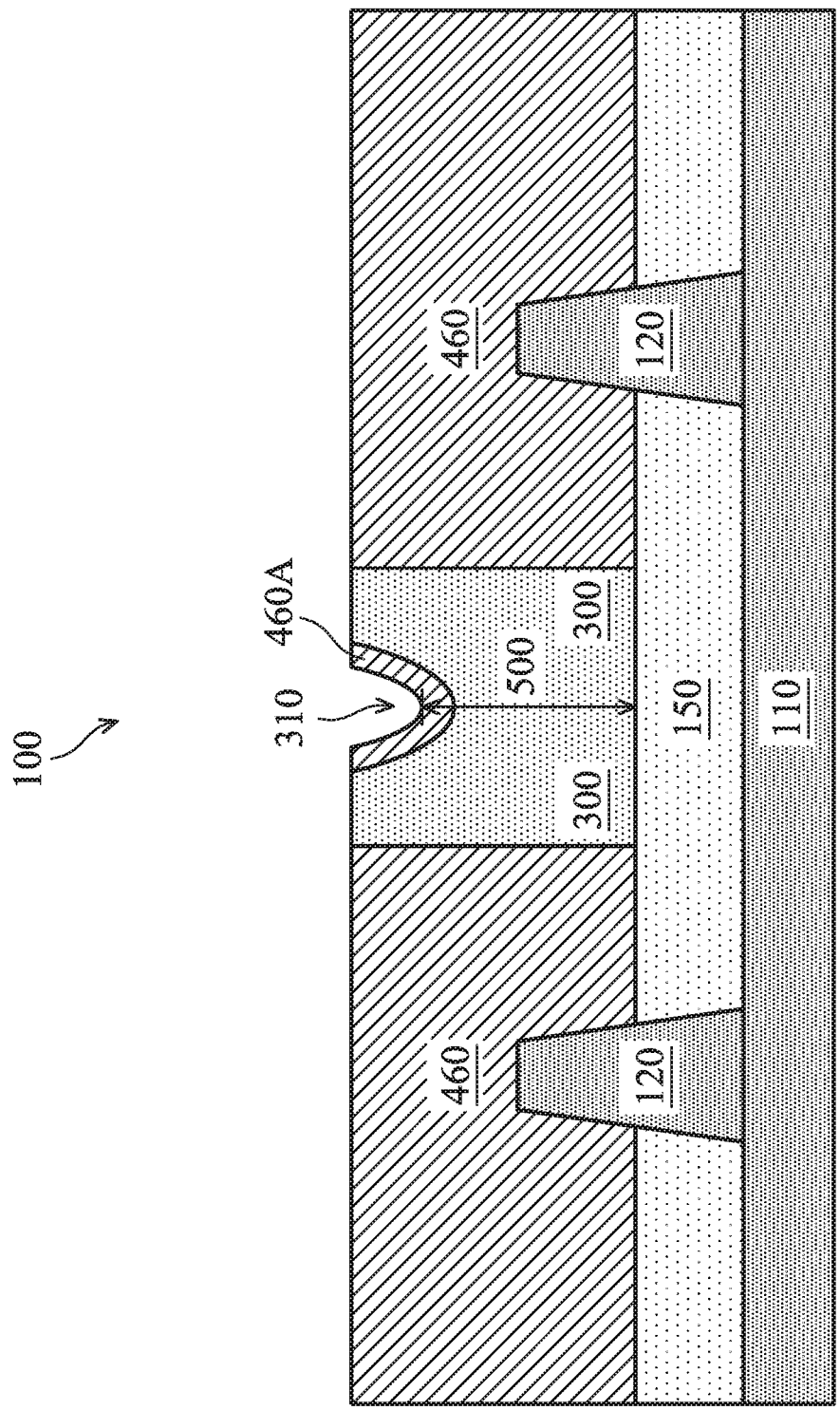
Figure 15:
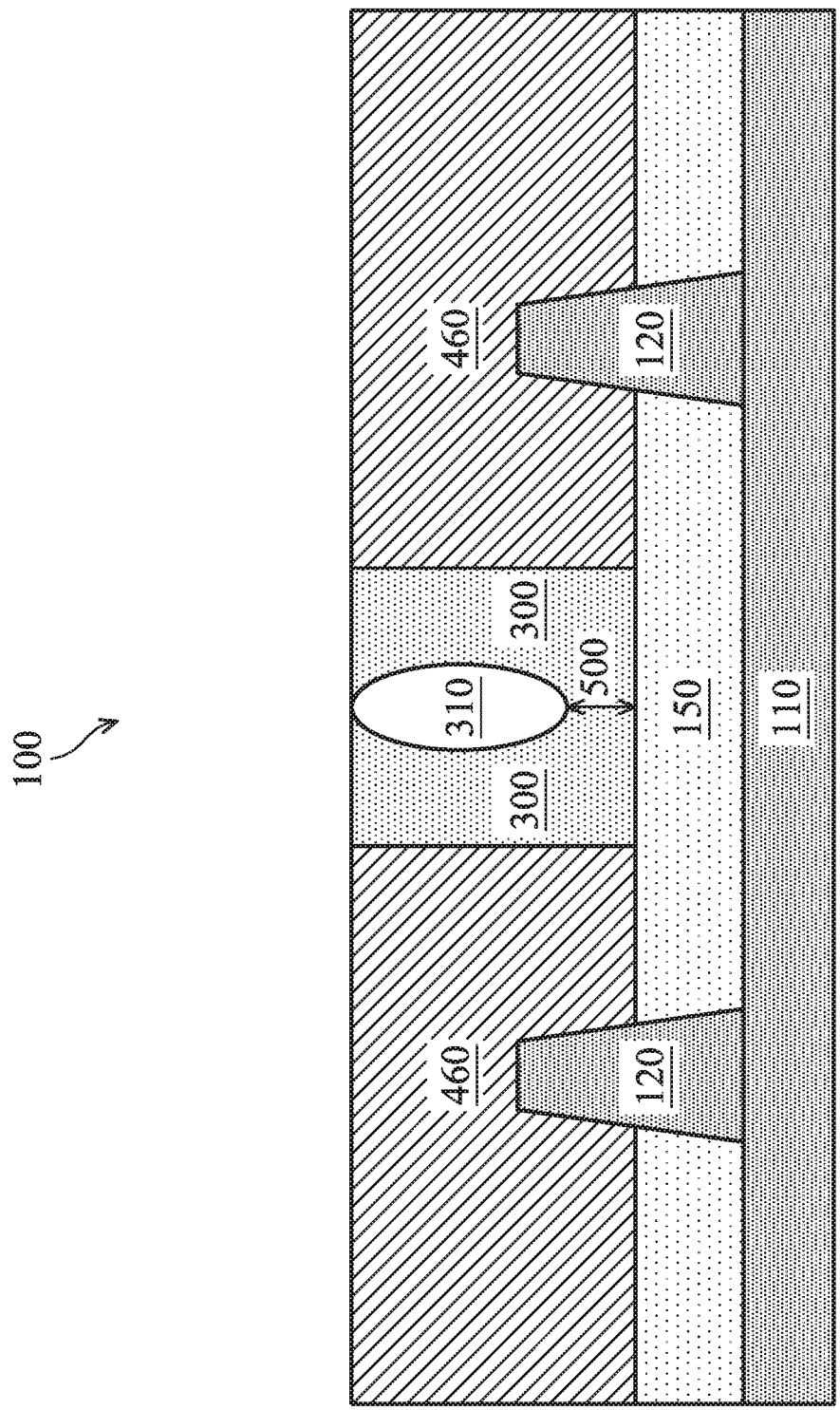

FIGS. 13, 14, and 15 illustrate the cross-sectional side views of other embodiments of the present disclosure, where the air gap 310 has different profiles and shapes. For example, as shown in the cross-sectional view of FIG. 13, the air gap 310 has a wider opening toward its top than the air gap 310 shown in FIG. 8B. In some embodiments, whereas the maximum lateral dimension 490 of the air gap 310 of FIG. 8B occurs somewhere near the middle of the air gap, the maximum lateral dimension 490 of the air gap of FIG. 13 occurs near its top. In other words, for the air gap 310 in FIG. 13, its lateral dimension gradually decreases as its gets deeper (e.g., closer to the isolation structure 150).

In another example, as shown in the cross-sectional view of FIG. 14, the air gap 310 has a greater depth 500 than the air gap 310 of FIG. 8B. As such, the air gap 310 of FIG. 14 may have a smaller volume than the air gap 310 in FIG. 8B.

In yet another example, as shown in the cross-sectional view of FIG. 15, the air gap 310 does not have the high-k gate dielectric material and/or the metal gate electrode material formed therein. As discussed above, this may be caused by the air gap 310 being sufficiently small.

It is understood that the top and cross-sectional views of the different embodiments of the air gap 310 shown in FIGS. 9-15 are merely examples. In real world fabrication, the actual profiles or shapes of the air gap 310 may not have a precise geometric shape (e.g., a circle or an oval). Instead, the actually-formed air gap 310 may just loosely resemble the shapes or profiles discussed above, while having various bumps, protrusions, and/or recesses along its surfaces, which may not necessarily be smooth.

Regardless of the particular embodiment of the air gap 310, it is understood that its formation may be a result of the unique fabrication process flow of the present disclosure discussed above. For example, the "pull back" process 250 discussed above with reference to FIG. 4B causes "overhangs" 170A of the patterned mask layer 170. The "overhangs" 170A may partially obstruct or interfere with the subsequent deposition of the dielectric material 300 in the opening below the "overhangs" 170A. The obstructed deposition of the dielectric material 300 may trap the air gap 310 within the dielectric material 300. Since the air gap 310 contains mostly air—which has a relatively high electrical resistivity—the air gap 310 offers good electrical isolation between the adjacent high-k metal gate structures 460.

Figure 16:
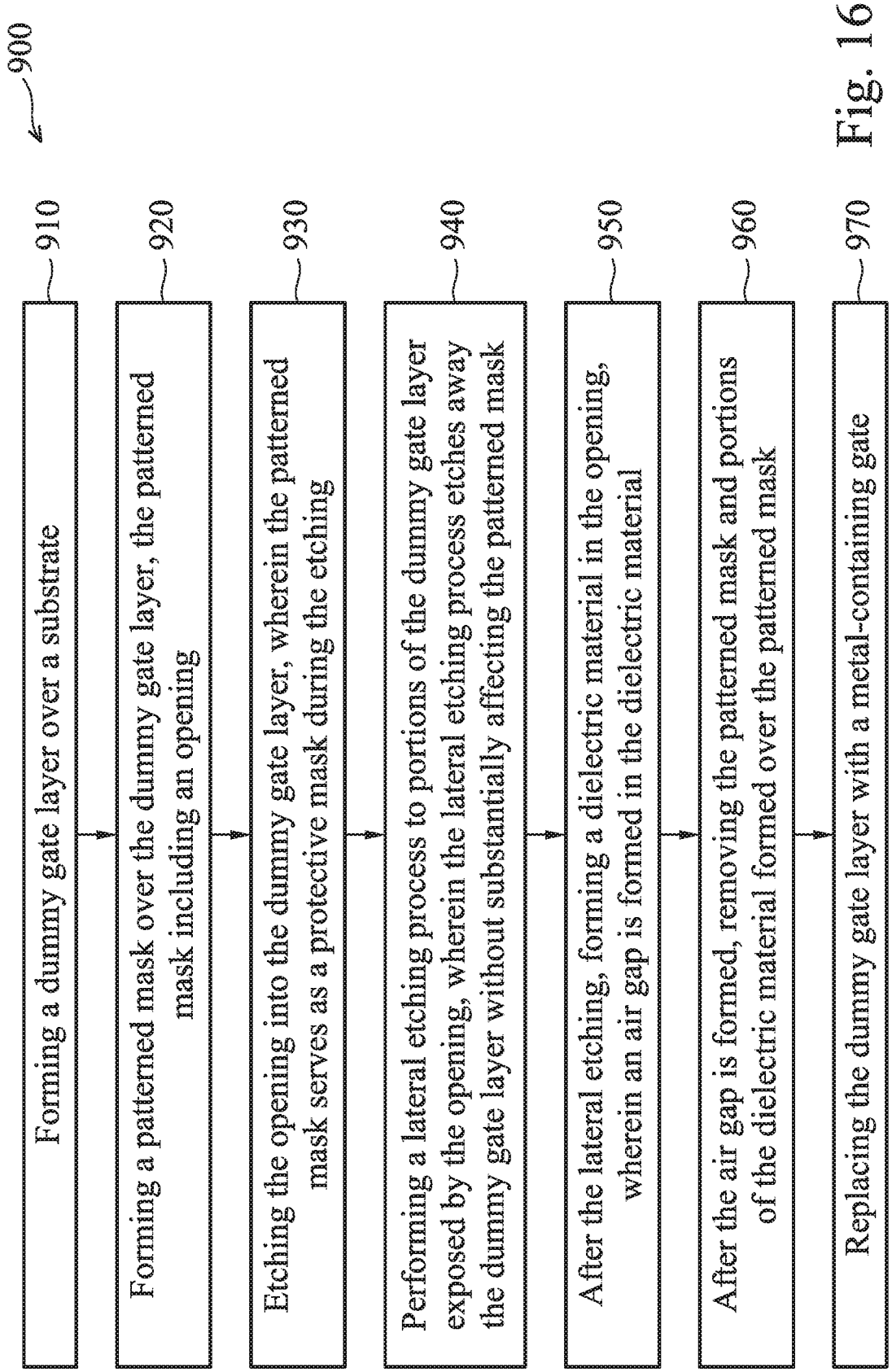
FIG. 16 is a flowchart of a method for fabricating a FinFET device in accordance with embodiments of the present disclosure.

FIG. 16 is a flowchart of a method 900 for fabricating a FinFET device in accordance with various aspects of the present disclosure. The method 900 includes a step 910 of forming a dummy gate layer over a substrate.

The method 900 includes a step 920 of forming a patterned mask over the dummy gate layer, the patterned mask including an opening.

The method 900 includes a step 930 of etching the opening into the dummy gate layer. The patterned mask serves as a protective mask during the etching.

The method 900 includes a step 940 of performing a lateral etching process to portions of the dummy gate layer exposed by the opening. The lateral etching process etches away the dummy gate layer without substantially affecting the patterned mask. In some embodiments, the etching of the opening performed in step 930 separates the dummy gate layer into a first segment and a second segment, but bottom portions of the first segment and the second segment still remain in contact with each other. In some embodiments, the lateral etching process is performed in step 940 is performed such that the first segment and the second segment of the dummy gate layer are no longer in contact with each other.

The method 900 includes a step 950 of, after the lateral etching, forming a dielectric material in the opening. An air gap is formed in the dielectric material. In some embodiments, the lateral etching process performed in step 940 causes portions of the patterned mask to form overhangs over the opening. The air gap is formed in the dielectric material at least in part due to the overhangs.

The method 900 includes a step 960 of, after the air gap is formed, removing the patterned mask and portions of the dielectric material formed over the patterned mask.

The method 900 includes a step 970 of replacing the dummy gate layer with a metal-containing gate. In some embodiments, the replacing comprises removing the dummy gate layer and forming a first gate structure and a second gate structure as the metal-containing gate. The first gate structure and the second gate structure are formed on opposite sides of the air gap. In some embodiments, the forming of the first gate structure and the second gate structure comprises depositing a high-k gate dielectric and a metal gate electrode in place of the removed dummy gate layer. In some embodiments, the depositing deposits portions of the high-k gate dielectric or portions of the metal gate electrode in the air gap.

It is understood that additional process steps may be performed before, during, or after the steps 910-970 discussed above to complete the fabrication of the semiconductor device. For example, before the dummy gate layer is formed, the method 900 may further include a step of forming a first fin structure and a second fin structure that each protrude upwardly out of the substrate. The first gate structure and the second gate structure are formed to wrap around the first fin structure and the second fin structure, respectively. In some embodiments, the first gate structure and the second gate structure are each formed to extend along a first direction, the first fin structure and the second fin structure are each formed to extend along a second direction that is different from the first direction, and the air gap separates the first gate structure and the second gate structure in the first direction. Additional steps may be performed, such as contact formation, testing, packaging, etc.

Based on the above discussions, it can be seen that the present disclosure offers advantages over conventional Fin-FET and the fabrication thereof. It is understood, however, that other embodiments may offer additional advantages, and not all advantages are necessarily disclosed herein, and that no particular advantage is required for all embodiments. One advantage is that, by using the lateral etching process to "pull back" the dummy gate layer, the present disclosure enlarges the process windows and reducing the lithography/etching process loading. The lateral etching process also removes (or reduces) the remnants of the dummy gate layer that should have been removed by the dummy gate "cut". The removal or reduction of the remnants of the dummy gate layer minimizes the "footing" profile of the dummy gate. In addition to improving the critical dimension, the reduction of the "footing" profile also decreases the line-end bridging risks when high-k metal gates are formed to replace the dummy gates. Consequently, the FinFET devices fabricated according to the present disclosure are less likely to have leakage issues or other reliability problems, and may have better yield compared to conventional FinFET devices. Furthermore, the unique process flow described herein allows an air gap to be embedded in the dielectric material between the adjacent high-k metal gates. Due to the high electrical resistivity of the air gap, the FinFET devices fabricated herein also offers improved electrical isolation between transistors located close to one another. In addition, the various aspects of the present disclosure are compatible with current fabrication process flow and are easy to implement, and therefore inexpensive to implement in actual fabrication.

One embodiment of the present disclosure involves a semiconductor device. The semiconductor device includes a first gate structure disposed over a substrate, the first gate structure extending in a first direction. The semiconductor device includes a second gate structure disposed over the substrate, the second gate structure extending in the first direction. The semiconductor device includes a dielectric material disposed between the first gate structure and the second gate structure. The semiconductor device includes an air gap disposed within the dielectric material.

Another embodiment of the present disclosure involves a semiconductor device. The semiconductor device includes a first fin structure and a second fin structure each protruding over a substrate. The first fin structure and the second fin structure each extend in a first direction. The semiconductor device includes a first gate structure and a second gate structure located over, and partially wrap around, the first fin structure and the second fin structure, respectively. The first gate structure and the second gate structure each extend in a second direction that is perpendicular to the first direction. The semiconductor device includes a first dielectric material located between the first gate structure and the second gate structure. The semiconductor device includes a void embedded in the first dielectric material.

Another embodiment of the present disclosure involves a method. A dummy gate layer is formed over a substrate. A patterned mask is formed over the dummy gate layer, the patterned mask including an opening. The opening is etched into the dummy gate layer. The patterned mask serves as a protective mask during the etching. A lateral etching process is performed to portions of the dummy gate layer exposed by the opening. The lateral etching process etches away the dummy gate layer without substantially affecting the patterned mask. After the lateral etching, a dielectric material is formed in the opening. An air gap is formed in the dielectric material. After the air gap is formed, the patterned mask and portions of the dielectric material formed over the patterned mask are removed. The dummy gate layer is replaced with a metal-containing gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dummy gate layer over a substrate;
    forming a patterned mask over the dummy gate layer, the patterned mask including an opening;
    etching the opening into the dummy gate layer, wherein the patterned mask serves as a protective mask during the etching;
    performing a lateral etching process to portions of the dummy gate layer laterally exposed by the opening, wherein the lateral etching process etches away the dummy gate layer without substantially affecting the patterned mask;
    after the lateral etching, forming a dielectric material in the opening, wherein an air gap is formed in the dielectric material;
    after the air gap is formed, removing the patterned mask and portions of the dielectric material formed over the patterned mask; and
    replacing the dummy gate layer with a metal-containing gate, wherein the metal-containing gate contains one or more materials that are at least partially formed inside the air gap.

2. The method of claim 1, wherein the replacing comprises removing the dummy gate layer and forming a first gate structure and a second gate structure as the metal-containing gate, and wherein the first gate structure and the second gate structure are formed on opposite sides of the air gap.

3. The method of claim 2, wherein the forming of the first gate structure and the second gate structure comprises depositing a high-k gate dielectric and a metal gate electrode in place of the removed dummy gate layer.

4. The method of claim 3, wherein the depositing deposits portions of the high-k gate dielectric or portions of the metal gate electrode at least partially within the air gap.

5. The method of claim 2, further comprising, before the forming of the dummy gate layer: forming a first fin structure and a second fin structure that each protrude upwardly out of the substrate, and wherein the first gate structure and the second gate structure are formed to wrap around the first fin structure and the second fin structure, respectively.

6. The method of claim 5, wherein:
the first gate structure and the second gate structure are each formed to extend along a first direction;
the first fin structure and the second fin structure are each formed to extend along a second direction that is different from the first direction; and
the air gap separates the first gate structure and the second gate structure in the first direction.

7. The method of claim 1, wherein:
the lateral etching process causes portions of the patterned mask to form overhangs over the opening; and
the air gap is formed in the dielectric material at least in part due to the overhangs.

8. The method of claim 1, wherein:
the etching of the opening separates the dummy gate layer into a first segment and a second segment, but bottom portions of the first segment and the second segment still remain in contact with each other; and
the lateral etching process is performed such that the first segment and the second segment of the dummy gate layer are no longer in contact with each other.

9. A method, comprising:
forming a dummy gate layer over a first fin structure and a second fin structure, wherein the dummy gate layer contains polysilicon, wherein the first fin structure and the second fin structure are separated by a dielectric isolation structure, wherein the dummy gate layer extends in a first direction, and wherein the first fin structure and the second fin structure each extend in a second direction different from the first direction;
forming a gap in the dummy gate layer, wherein the gap is enclosed and formed over the dielectric isolation structure and between the first fin structure and the second fin structure; and
replacing the dummy gate layer with a metal-containing gate layer.

10. The method of claim 9, wherein an upper surface of the dielectric isolation structure is located below an upper surface of the first fin structure or an upper surface of the second fin structure.

11. The method of claim 9, wherein the forming the gap comprises forming an air gap in the dummy gate layer, wherein the method further comprises: performing a polishing process before the dummy gate layer is replaced, wherein the polishing process opens the air gap.

12. The method of claim 9, wherein the first direction is perpendicular to the second direction, and wherein the gap is formed to have a greater vertically dimension than a horizontal dimension.

13. The method of claim 9, wherein the forming the gap comprises:
etching a recess in a portion of the dummy gate layer between the first fin structure and the second fin structure; and
partially filling the recess with a dielectric material, wherein the gap is trapped within the dielectric material.

14. The method of claim 13, wherein the replacing the dummy gate layer is performed without removing the dielectric material.

15. The method of claim 14, wherein the replacing the dummy gate layer comprises forming a portion of the metal-containing gate layer on the dielectric material within the gap.

16. The method of claim 13, further comprising: laterally etching the dummy gate layer after the recess has been etched but before the recess has been partially filled by the dielectric material.

17. The method of claim 16, wherein the etching the recess comprises:
forming a mask layer over the dummy gate layer, the mask layer including an opening; and
etching a portion of the dummy gate layer through the opening to form the recess.

18. The method of claim 17, wherein:
the laterally etching the dummy gate layer is performed such that overhangs of the mask layer are formed over the recess after the dummy gate layer has been laterally etched; and
the partially filling the recess comprises performing a deposition process to fill the recess, wherein the deposition process traps the gap within the dielectric material due to the overhang.

19. A method, comprising:
forming a dummy gate layer over a first fin structure and a second fin structure, wherein the dummy gate layer extends in a first direction, and wherein the first fin structure and the second fin structure each extend in a second direction perpendicular to the first direction;
forming a mask layer over the dummy gate layer, the mask layer including an opening;
performing a first etching process to vertically extend the opening into the dummy gate layer;
performing a second etching process to horizontally recess portions of the dummy gate layer underneath the mask layer, wherein the second etching process causes overhangs of the mask layer to be formed above the opening;
depositing a dielectric material through the opening, wherein the overhangs cause an air bubble to be trapped within the deposited dielectric material;
removing the dummy gate layer without removing the dielectric material having the air bubble trapped therein; and
forming a first metal-containing gate structure over the first fin structure and forming a second metal-containing gate structure over the second fin structure, wherein the first metal-containing gate structure and the second metal-containing gate structure are formed on opposite sides of the dielectric material in the first direction.

20. The method of claim 19, wherein the forming of the first metal-containing structure and the forming of the second metal-containing gate structure forms a metal material within the air bubble.

* * * * *